United States Patent
Kobayashi et al.

(10) Patent No.: US 7,265,409 B2
(45) Date of Patent: Sep. 4, 2007

(54) NON-VOLATILE SEMICONDUCTOR MEMORY

(75) Inventors: Toshio Kobayashi, Kanagawa (JP); Hideto Tomiie, Kanagawa (JP)

(73) Assignee: Sony Corporation, Tokyo (JP)

( * ) Notice: Subject to any disclaimer, the term of this patent is extended or adjusted under 35 U.S.C. 154(b) by 79 days.

(21) Appl. No.: 11/152,330

(22) Filed: Jun. 14, 2005

(65) Prior Publication Data

US 2005/0281086 A1 Dec. 22, 2005

(30) Foreign Application Priority Data

Jun. 16, 2004 (JP) ............................. P2004-178364

(51) Int. Cl.
*H01L 29/76* (2006.01)

(52) U.S. Cl. .............................. 257/314; 257/E21.662; 257/E21.379

(58) Field of Classification Search ........ 257/E21.662, 257/E21.679, 314; 438/257
See application file for complete search history.

(56) References Cited

U.S. PATENT DOCUMENTS

| | | | | |
|---|---|---|---|---|
| 5,482,880 A | * | 1/1996 | Kaya et al. ................. | 438/257 |
| 5,719,423 A | * | 2/1998 | Todd et al. ................. | 257/336 |
| 6,330,187 B1 | * | 12/2001 | Choi et al. ............. | 365/185.15 |
| 6,465,834 B1 | * | 10/2002 | Nakazato et al. ........... | 257/314 |
| 6,477,092 B2 | * | 11/2002 | Takano ................... | 365/189.11 |
| 6,525,965 B2 | * | 2/2003 | Ghodsi ................... | 365/185.18 |
| 6,914,820 B1 | * | 7/2005 | Wong ..................... | 365/185.18 |
| 6,963,102 B2 | * | 11/2005 | Mori .......................... | 257/315 |
| 7,075,143 B2 | * | 7/2006 | Fujiwara et al. ............. | 257/324 |
| 7,145,808 B2 | * | 12/2006 | Fujiwara et al. ........ | 365/185.28 |
| 2004/0155234 A1 | * | 8/2004 | Ishimaru et al. .............. | 257/10 |
| 2005/0232015 A1 | * | 10/2005 | Mori ...................... | 365/185.18 |

* cited by examiner

*Primary Examiner*—Thao P. Le
(74) *Attorney, Agent, or Firm*—Sonnenschein Nath & Rosenthal LLP

(57) ABSTRACT

A non-volatile semiconductor memory having a memory transistor including a stacked-layer film formed between a semiconductor substrate and a gate electrode and having a charge storage ability, a first conductivity type region of the semiconductor substrate in which a channel is formed under the control of the gate electrode via the stacked-layer film, and two second conductivity type regions formed at the semiconductor substrate sandwiching the first conductivity type region therebetween, the memory transistor having a channel length L which is between channel lengths L1 and L2, with the channel length L1 being estimated as the boundary of occurrence of a short channel effect at the time of a write operation and the channel length L2 the time of a read operation, with the channel length L1 being different from the channel length L2.

10 Claims, 25 Drawing Sheets

<EXAMPLE 1>

<SHALLOW TRENCH ISOLATION>

<EXAMPLE 2>

<EXAMPLE 3>

<EXAMPLE 4>

<EXAMPLE 5>

<EXAMPLE 7>

NON-VOLATILE SEMICONDUCTOR MEMORY

CROSS REFERENCES TO RELATED APPLICATIONS

This application claims the benefit of Japan Patent Application No. P2004-178364, filed Jun. 16, 2004, the contents of which are hereby incorporated herein by reference in their entirety.

BACKGROUND OF THE INVENTION

1. Field of the Invention

The present invention relates to a non-volatile semiconductor memory for storing data by injecting a charge into a stacked-layer film having a charge storage ability.

2. Description of the Related Art

In the past, a non-volatile memory injecting a charge into a stacked-layer film having a charge storage ability under predetermined voltage conditions desirably has used a high voltage for write and erase operations. Further, such a non-volatile memory has sometimes been combined with a logic circuit on the same IC. Below, such an IC is referred to as a "combination non-volatile memory". In a combination non-volatile memory, a voltage higher than the voltage for driving the logic circuit is generated for operating the non-volatile memory, so high withstand (torelance) voltage devices (devices able to operate at a high voltage) are desirable in addition to the logic transistors and other devices able to operate at a standard power voltage.

This means it is desirable to form not only the non-volatile memory, but also the high withstand voltage devices on the same IC in the wafer production process of a combination non-volatile memory. This leads to an increase of the production steps and an increase of the number of masks. Incidentally, in an IC mounting the currently mainstream floating gate (FG) type memory devices in combination, in practice about a half of the masks added to the masks required for the standard logic process are for the high withstand voltage devices. Accordingly, when establishing a combination process of combining a non-volatile memory with an existing logic process, if lowering the voltage of the memory devices to an extent that they may operate with the standard provided voltage (logic use power voltage etc.), high withstand voltage transistors become unnecessary and the number of steps for combination and the increase of the number of additional masks may be suppressed. In this way, lowering the operating voltage is an important issue in combination non-volatile memories.

The rise of the threshold voltage when raising the threshold voltage from the level of the non-write state to the level of the write state at the time of a write operation is usually called as a "window". In a memory device, the window becomes small during long term storage at a high temperature and further while write and erase operations are repeated many times. For this reason, when reading whether or not a write operation was effectively performed according to the difference of the amount of channel current when applying predetermined voltage conditions enabling a memory transistor to be turned ON, it is desirable to make the window immediately after the write operation large enough for maintaining the long term reliability of electrical characteristics while securing the lowest voltage margin necessary for a read operation. However, if the operating voltage is lowered, the window becomes proportionally smaller. The fact that the window immediately after the write operation becomes smaller together with the operating voltage is becoming an obstacle (hurdle) to lowering the voltage. Therefore, various means for reducing the operating voltage in combination non-volatile memories are being proposed from a variety of viewpoints (refer to for example Japanese Unexamined Patent Publication (Kokai) No. 2001-102553).

Turning now to the disadvantage to be solved by the invention, Japanese Unexamined Patent Publication (Kokai) No. 2001-102553 tries to reduce the absolute value of the operating voltage by supplying the operating voltage to the memory devices of a combination non-volatile memory divided into a negative voltage and a positive voltage, but does not study the method of raising the threshold voltage of the memory devices to the maximum by a voltage corresponding to the prepared power voltage.

SUMMARY OF THE INVENTION

It is desirable to provide a non-volatile semiconductor memory with a voltage for storage (maximum threshold (torelance) voltage at time of read operation) higher than a voltage supplied at the time of a write operation and particularly provide a device structure of a non-volatile semiconductor memory suitable for the same.

According to the present invention, there is provided a non-volatile semiconductor memory having a memory transistor including a stacked-layer film formed between a semiconductor substrate and a gate electrode and having a charge storage ability, a first conductivity type region of the semiconductor substrate in which a channel is formed under the control of the gate electrode via the stacked-layer film, and two second conductivity type regions formed at the semiconductor substrate sandwiching the first conductivity type region therebetween, in the memory transistor, channel lengths, estimated for determining the boundary of occurrence of short channel effects at the time of a write operation and at the time of a read operation, being different, and the memory transistor having a channel length of an actual device between the different channel lengths.

According to the present invention, there is also provided a non-volatile semiconductor memory having a memory transistor including a stacked-layer film formed between a semiconductor substrate and a gate electrode and having a charge storage ability, a first conductivity type region of the semiconductor substrate in which a channel is formed under the control of the gate electrode via the stacked-layer film, and two second conductivity type regions formed at the semiconductor substrate sandwiching the first conductivity type region therebetween, the memory transistor having a device structure of which at least one of the structural parameters defining the channel lengths differs at the time of a write operation when using one of the two second conductivity regions as a drain and at the time of a read operation when using the other as the drain, to make different the channel lengths, estimated for determining the boundary of occurrence of short channel effects at the time of a write operation and at the time of a read operation.

According to the non-volatile semiconductor memories of the above invention configured in this way, the channel length, estimated for determining the boundary of occurrence of the short channel effects at the time of a write operation and at the time of a read operation deffer. Here, the "channel length estimated for determining the boundary of occurrence of the short channel effects" means the channel lengths at the boundary of where the short channel effect "occurs" and "does not substantially occur", that is, the channel length where if the channel length of the actual memory transistor is shorter, the threshold voltage falls due to the short channel effect, while where if the channel length of the actual memory transistor is longer, no short channel effect occurs, so the threshold voltage does not fall.

In the present invention, the channel length of the memory transistor of the non-volatile memory is set between the different channel lengths at the time of a write operation and at the time of a read operation.

Further, the present invention has a device structure of which at least one of the structural parameters defining the boundary channel length differs between the time of a write operation when using one of the two second conductivity regions as the drain and the time of a read operation when using the other as the drain, whereby the boundary channel length is changed at the time of a write operation and the time of a read operation.

According to the present invention, there is further provided a non-volatile semiconductor memory, performing a write operation on a memory transistor by injecting a charge into a stacked-layer film having a charge storage ability under predetermined voltage conditions and a read operation for reading whether or not the write operation was effectively performed, according to a difference of an amount of channel current when applying predetermined voltage conditions enabling the memory transistor to be turned ON, at the time of a write operation on the memory transistor in a non-written state, application of predetermined voltage conditions including a drain voltage different from the drain voltage at the time of a read operation, causing the start of injection of a charge from a threshold voltage of a first level on a non-write side from a second level taken by the memory transistor in a non-written state at the time of a read operation and to thereby change the threshold voltage to a threshold voltage of the written state positioned toward the write side and exceeding the second level.

Preferably, the threshold voltage of the memory transistor in the non-written state is changed from the state of the first level defined due to the short channel effect occurring under the voltage conditions at the time of the write operation toward the write side, by a write operation, and at the time of a read operation, predetermined voltage conditions where occurrence of the short channel effect is difficult to occur or dose not substantially occur and the threshold voltage of a memory transistor in the non-written state is defined as the second level positioned toward the write side and exceeding the first level are applied.

More preferably, by making the channel lengths, estimated for determining the boundary of occurrence of the short channel effects at the time of a write operation and the time of a read operation, different, and the write operation is commenced from the threshold voltage of the first level positioned toward the a non-write side and exceeding the second level which is defined by the threshold voltage of the memory transistor in the non-written state at the time of a read operation.

Further preferably, at the time of a write operation, a charge is injected until the difference between the maximum voltage applied to the gate electrode and the threshold voltage value changing at the time of the write operation becomes smaller than at least the difference of the first level and the second level.

According to the non-volatile semiconductor memory of the above present invention configured in this way, by making for example the channel lengths, estimated for determining the boundary of occurrence of the short channel effects at the time of a write operation and at the time of a read operation, at the time of a write operation different, and the write operation is commenced from the state where the threshold voltage is lowered from the second level at the time of a read operation to the first level. Further, the threshold voltage changes to a threshold voltage larger than the second level. The final threshold voltage is defined by the voltage conditions at the time of the write operation.

At this time, if the write operation is performed until the difference between the maximum voltage applied to the gate electrode and the value of the final threshold voltage at the time of the write operation becomes smaller than the difference of the first level and the second level, the final threshold voltage after the write operation becomes larger than the maximum voltage applied to the gate.

According to the present invention, there is provided a method of operation of the non-volatile semiconductor memory.

Summarizing the effects of the invention, according to the non-volatile semiconductor memory of the present invention, operation where a short channel effect occurs at the time of a write operation, but does not occur at the time of a read operation becomes possible. For this reason, compared with a case where a short channel effect does not occur, the injection of a charge at the time of a write operation starts from a threshold (torelance) voltage on the non-write side, so injection of a larger amount of charge is possible under the same voltage conditions. As a result, the difference between the threshold voltage in the written state and the threshold voltage in the non-written state is enlarged, the voltage margin at the time of the read operation is enlarged by that amount, and the electrical reliability such as the charge holding characteristic and data rewrite characteristic is improved. On the other hand, the voltage necessary for injecting the same amount of charge is lowered, so a reduction of the voltage is possible.

Further, according to the non-volatile semiconductor memory of the present invention, a write operation is possible from the state where the threshold voltage level at the time of commencement of the injection of the charge at the time of a write operation (first level) is at the non-write side from the threshold voltage level of the memory transistor in the non-written state at the time of a read operation (second level). For this reason, it is possible to make the amount of injected charge larger with the same application voltage in comparison with an ordinary case where the charge is injected from the second level. As a result, the difference between the threshold voltage in the written state and the threshold voltage in the non-written state is enlarged, the voltage margin at the time of the read operation is enlarged by that amount, and the electrical reliability such as the charge holding characteristic and the data rewrite characteristic is improved. On the other hand, the voltage necessary for injecting the same amount of charge is lowered, so a reduction of the voltage is possible.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, the application of the present invention to a MONOS type memory device having an N-type channel and performing a write operation by injecting a charge will be used as a representative example. Preferred embodiments of the present invention will be described based on this. In some embodiments, however, considering application to floating gate (FG) type memory devices, examples other than this representative example will be referred to after the description of all of the embodiments.

First Embodiment

Figure 1:
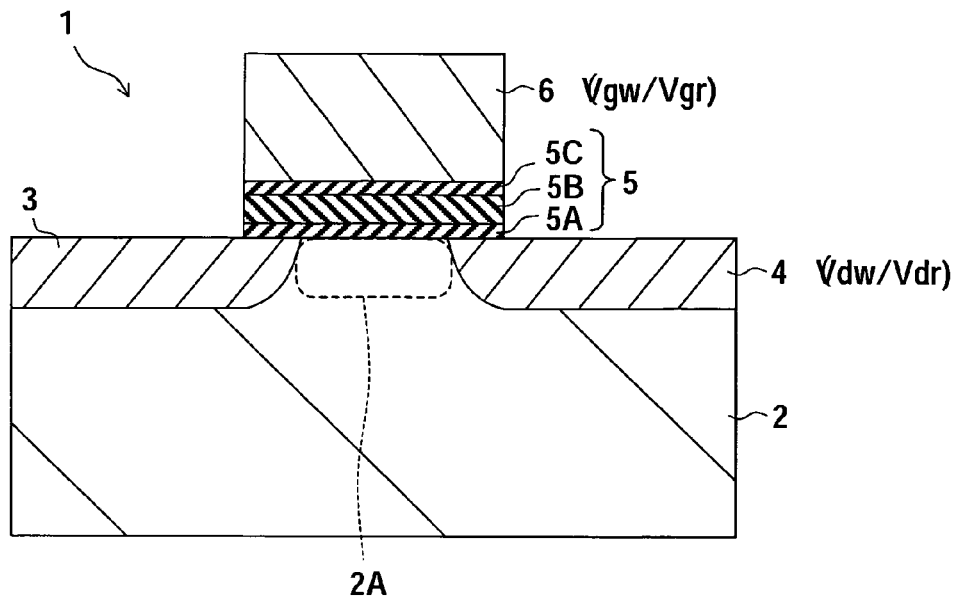
FIG. 1 is a sectional view of the structure of a memory device on which a first embodiment of the present invention is predicated.

FIG. 1 shows the structure of a memory device on which a first embodiment of the present invention is predicated. The device structure is basically the same as an ordinary MONOS type memory transistor in the point of the source side and the drain side being symmetric, so a detailed explanation will be omitted here. Further, also the method of production is substantially identical to that of an ordinary MONOS type memory transistor, so the explanation here will be omitted as well. However, it is sometimes desirable to optimize the structural parameters (for example, the channel length). This point will be explained later.

In FIG. 1, notation (reference) 1 shows a memory transistor. In the same way, notation 2 shows a semiconductor substrate, notation 2A shows a P-type semiconductor region in which a channel is formed (hereinafter referred to as a "channel formation region"), notation 3 shows an N-type source region, notation 4 shows an N-type drain region, notation 5 shows an oxide-nitride-oxide (ONO) type stacked-layer film having a charge storage ability, and notation 6 shows a gate electrode. Among them, the ONO type stacked-layer film 5 is constituted by, in the order from the bottom layer, a first oxide film 5A, a nitride film 5B mainly providing the charge storage ability, and a second oxide film 5C. Note that the selectable materials at the time of formation of this stacked-layer film 5 will be mentioned later. Further, the channel formation region 2A may be a P-type well formed in the semiconductor substrate 2 and further part of an SOI type semiconductor layer as well.

Note that, looking at the correspondence with the general recitation of the present invention given in the summary of the invention, the channel formation region constitutes an example of the "first conductivity type region" of the present invention, and the source region 3 and the drain region 4 constitute examples of the "two second conductivity type regions" of the present invention.

In the first embodiment, as shown in FIG. 1, the structure of the memory device is not made any special shape (that is, asymmetric between the source side and the drain side).

In the first embodiment, by controlling for example the combination of voltages applied to the drain region 4 among the predetermined voltage conditions at the time of a write operation and the time of a read operation, the operation of setting the threshold voltage in the non-written state serving as the basis for determining the amount of charge injection during a write operation at a first level lower than a second level of the threshold voltage in the non-written state at the time of a read operation (that is, on the non-write side), starting the write operation from the first level, and raising the threshold voltage up to the threshold voltage in the written state higher than the second level (that is, on the write operation side) is accomplished.

Here, the "threshold voltage in the non-written state" means the threshold voltage in the thermal equilibrium state immediately after production or the threshold voltage in the state where a charge of a polarity contributing to the write operation is sufficiently drained by an erase operation.

The storage state of a memory device is determined by the magnitude of the charge of a certain specific polarity in the stacked-layer film having the charge storage ability interposed between the semiconductor region in which the channel is formed and the gate electrode. Certain type of defects introduced into the stacked-layer film in the middle of production of the memory device sometimes exist in a thermally unstable state sometimes trapping a charge and sometimes releasing it.

Considered literally, it is possible to interpret the "threshold voltage in the non-written state" as including a threshold voltage determined by the existence of such a charge when a write operation has not yet been performed. However, in the present invention, a threshold voltage due to such a charge is not included in the "threshold voltage in the non-written state". In the present invention, the threshold voltage in the thermal equilibrium state in a state made thermally stable by sufficient heat treatment in the middle of production or after production or the threshold voltage in the state where a charge having a polarity contributing to a write operation is sufficiently drained by an erase operation performed preceding the write operation will be referred to as the "threshold voltage in the non-written state".

In the past, when the change of threshold voltage was discussed, it was assumed that the threshold voltage in the non-written state was substantially the same at the time of a read operation and the time of a write operation. As opposed to this, the inventors discovered that there is a state where the level of the threshold voltage in the non-written state at the time of a write operation (first level) is lower than the level of the threshold voltage in the non-written state at the time of a read operation (second level) and there is an operation mode enabling a write operation from that state and thereby that a write operation is possible up to a higher level even with a gate voltage at the time of a write operation the same as in the related art.

Below, an operation mode (operation method) where the threshold voltage in the non-written state differs between the time of a write operation and the time of a read operation will be explained. In this explanation, first the write and read operations will be summarized, then the relationships of threshold voltages in these operations will be expressed by general equations while comparing them with the related art. After this, the requirement on the device side for realizing the operation mode, that is, the enlargement of the short channel effect at the time of a write operation, and the structural parameters of the device for this purpose will be described.

At the time of a write operation, voltages suited to the drain and gate are supplied based on the source. Below, the voltage supplied to the drain at this time will be referred to as a "write drain voltage Vdw", while the voltage supplied to the gate will be referred to as a "write gate voltage Vgw". The write drain voltage Vdw and the write gate voltage Vgw are voltages high enough to cause a hot carrier effect in the channel of a memory transistor 1. As will be explained later, the voltage range of each differs in accordance with the hot carrier effect used.

Under predetermined write voltage conditions, high energy electrons (hot electrons) generated due to the hot carrier effect overcome the height of the potential barrier formed by the first oxide film 5A shown in FIG. 1 and are injected into the storage film 5. They are trapped and held by carrier traps in the region centered around the inside nitride film 5B. This injection of electrons is continuously performed during a write operation. Due to this, the threshold voltage of the memory transistor 1 gradually (strictly speaking, although in a very short time) rises and reaches a final value determined by the voltage conditions. Here, assume that the write operation time is sufficiently long, and a write operation up to the final value is performed. Note that, where a write operation is not performed, the injection of electrons is prevented by making at least one of the write drain voltage Vdw and the write gate voltage Vgw sufficiently low.

In such a write operation, in order to write the data up to as high a threshold voltage as possible with a low voltage, desirably the write gate voltage Vgw and the write drain voltage Vdw are set at almost equal values. Further, if not boosting the power voltage by the combination non-volatile memory etc., desirably the setting is made the maximum supplied voltage, that is, the power voltage or so, for the same reason. Further, even if boosting the threshold voltage to the power voltage or more, desirably the device is operated by a voltage not more than the permissible withstand voltage of the standard used transistor.

Next, the hot carriers (here, hot electrons) generated by passing a current through the channel at the time of a write operation will be explained. As the hot carriers able to be used at this time, the following three hot carriers having different mechanisms of generation (hot carrier effects) are known. First is a channel hot carrier. This channel hot carrier is generated under the voltage condition "the write gate voltage Vgw is higher than the write drain voltage Vdw". Second is a drain avalanche hot carrier. This drain avalanche hot carrier is generated under the voltage condition "the write gate voltage Vgw is not more than the write drain voltage Vdw". Third is a secondary generated hot carrier due to for example ionization collision. This hot carrier is generated under the condition for example "in the case of an N-type channel, a substrate voltage Vsub is lower than about −3V".

In this embodiment of the present invention (including also the second embodiment), a write operation is possible when any of the first to third hot carrier generation mechanisms is used. However, for the purpose of low voltage operation, there is a certain desirable hot carrier generation mechanism. Explaining this below, first, the write drain voltage Vdw, that is, the voltage supplied to a conductive region (drain region 4) deeper than the channel layer should be at least about 3V when the stacked-layer film 5 is an ONO film and a silicon oxide film is used for the first oxide film 5A. This is because the height of potential barrier of the oxide film seen from the silicon is about 3.2 eV. Therefore, when desiring the most efficient write operation, as previously explained, the write drain voltage Vdw and the write gate voltage Vgw are made equal, and the target of the low voltage write operation (final threshold voltage) is made 3V.

At this time, if listing the mechanisms of generation of hot carriers in the order of ability to write data with a lower voltage, the sequence becomes the third, the second, and the first. However, a negative voltage is necessary for the generation of the third secondary generated hot carriers.

Summarizing the above, when it is possible to utilize both a positive voltage and a negative voltage, the third hot carrier generation mechanism is desirably employed, while when it is desirable to perform a low voltage operation with only a positive voltage, the second hot carrier generation mechanism (drain avalanche hot carrier generation mechanism) is desirably employed. Each of them is employed under the control of the operating voltage conditions explained above.

Next, the read operation will be described. At the time of a read operation, voltages suitable to the drain and the gate are supplied based on the source. Note that the voltage conditions at the time of a read operation are different from the voltage conditions at the time of a write operation. Below, the voltage supplied to the drain at this time will be referred to as the "read drain voltage Vdr", and the voltage supplied to the gate will be referred to as the "read gate voltage Vgr". The read drain voltage Vdr and the read gate voltage Vgr are voltages of extents that no hot carrier effect at all occurs in the channel of the memory transistor or the hot carrier effect occurs to only an extent where a change of the threshold voltage is not caused unlike the time of a write operation. These drain voltage and gate voltage are usually set at values lower than those at the time of a write operation.

Under these read voltage conditions, a difference arises in the channel current between a memory transistor on which a write operation has already effectively been performed and a memory transistor on which a write operation has not been performed. This is because the effect of the electric field exerted upon the channel formation region 2A by the read gate voltage Vgr is weakened by the injected charge. This difference of currents is amplified as it is or is converted to voltage, amplified, then detected so as to read the stored data.

Note that, in FIG. 1, the direction of application of the read drain voltage Vdr and the direction of application of the write drain voltage Vdw are made the same between the source and the drain. This is because it is possible to shorten the time for charging/discharging the drain region 4 etc. when carrying out a read operation after a write operation and because aligning the directions of application of the drain voltage at the time of a read operation and the time of a write operation enables simplification of the configuration of the peripheral circuits supplying the voltages. Note that if making the directions opposite, the read sensitivity is better. If giving priority to this, the direction of application of the read drain voltage Vdr may be made opposite to the direction of application of the write drain voltage Vdw.

This completes the summary of the write and read operations. Next, the point of making the threshold voltage in the non-written state different between the time of a write operation and the time of a read operation will be explained with reference to equations.

The maximum value of the rise of the threshold voltage due to a write operation (hereinafter referred to as the "maximum threshold value rise at a write operation") $\Delta \text{Vth}(W)\text{max}$ is the difference between the final threshold voltage after a write operation (hereinafter referred to as the "threshold voltage after a write operation") $\text{Vth}(W)\text{max}$ and the threshold voltage in the non-written state before a write operation (hereinafter also referred to as the "threshold voltage before a write operation") $\text{Vth}(W)\text{ini}$. This is shown in the following equation (1):

$$\Delta \text{Vth}(W)\text{max} = \text{Vth}(W)\text{max} - \text{Vth}(W)\text{ini} \qquad (1)$$

The maximum threshold voltage obtained by a write operation at this time, that is, the threshold voltage Vth(W) max after a write operation, will never become more than the maximum voltage applied to the gate based on the source potential (hereinafter this maximum applied voltage referred to as "VDDmax").

On the other hand, at the time of a read operation, the threshold voltage when applying the read drain voltage Vdr differs according to whether or not a write operation has already been performed. The threshold voltage when a write operation has already been performed at this time, that is, the threshold voltage Vth(R)max in the written state at the time of a read operation, is determined according to the threshold voltage Vth(R)ini in the non-written state at the time of a read operation and the maximum threshold value rise $\Delta \text{Vth}(W)\text{max}$ at the time of a write operation shown in equation (1) and becomes as shown in the following equation (2):

$$\text{Vth}(R)\text{max} = \Delta \text{Vth}(W)\text{max} + \text{Vth}(R)\text{ini} \qquad (2)$$

In an ordinary non-volatile memory, the threshold voltage Vth(W) in the non-written state at the time of a write operation is substantially equal to the threshold equation (1) and equation (2), the threshold voltage Vth(R)max in the written state at the time of a read operation shown in equation (2) becomes substantially equal to the threshold voltage after write operation Vth(W)max. That is, the high level threshold voltage after injecting a charge by a write operation becomes the high level threshold voltage at the time of a read operation as it is.

The inventors devised a non-volatile memory with a device structure with two different low level threshold voltages at the time of a write operation and the time of a read operation, in more detail, a non-volatile memory in which the level of the threshold voltage Vth(W)ini in the non-written state at the time of a write operation (first level) becomes smaller than the level of the threshold voltage Vth(R)ini in the non-written state at the time of a read operation (second level). Note that, the first embodiment relates to the setting of structural parameters for achieving this. An asymmetric device structure will be explained in other embodiments later.

In such a device structure, at the time of a write operation, the injection of electrons is commenced from a lower first level, and the threshold voltage rises up to the threshold voltage after a write operation Vth(W)max determined by the write voltage conditions. Therefore, when compared with the case where the injection of electrons is commenced from the second level as in the past, the amount of the injected charge becomes larger by exactly an amount corresponding to the threshold voltage of the difference between the first level and the second level.

Contrary to this, the high level threshold voltage Vth(R) max not more than the read voltage conditions obtained by the injection of electrons from the second level becomes equal to the threshold voltage after a write operation Vth (W)max as previously explained. Accordingly, the threshold voltage Vth(R)max in the written state under the read voltage conditions where the present invention is applied becomes higher by exactly the threshold voltage at the time of the commencement of the injection of electrons at the time of a write operation (difference between the second level and the first level) compared with the threshold voltage Vth(R)max obtained by the injection of electrons from the second level. This is expressed by the following equation (3):

$$\text{Vth}(R)\text{max} - \text{Vth}(W)\text{max} = \text{Vth}(R)\text{ini} - \text{Vth}(W)\text{ini} \qquad (3)$$

Next, the threshold voltage difference (difference between the second level and the first level) at the time of the start of the injection of electrons at the time of a write operation indicated by the right side of this equation (3) is increased to a certain extent. Specifically, this threshold voltage difference is desirably made larger than the difference between the maximum voltage VDDmax applied to the gate and the threshold voltage after a write operation Vth(W)max. This is expressed by the following inequality (4):

$$\text{VDDmax}-\text{Vth}(W)\text{max} < \text{Vth}(R)\text{ini}-\text{Vth}(W)\text{ini} \quad (4)$$

The following inequality (5) is found from this equation (4) and equation (3).

$$\text{Vddmax} < \text{Vth}(R)\text{max} \quad (5)$$

From the above description, so far as the write operation is performed until the final threshold voltage Vth(W)max at the time of a write operation satisfies the inequality (4), it is possible to realize a maximum threshold voltage at a read operation Vth(R)max more than the maximum operating voltage at a write operation VDDmax.

From the above, by making the difference (window) between the written state and non-written state (erased state) larger, the voltage margin at the time of a read operation may be enlarged. Further, it becomes possible to improve the charge holding characteristic and the rewrite characteristic (long term reliability of the electrical characteristics). Further, if assuming that the voltage margin at the time of a read operation and the long term reliability of the electrical characteristics are the same, it becomes possible to reduce the power voltage by that amount. In order to obtain the relationship of the above inequality (5), in a write operation, it is necessary to lower the threshold voltage Vth(W)ini in the non-written state to the low level (first level) satisfying the relationships of equation (3) and equation (4) compared with the threshold voltage of the second level. For this reason, in this embodiment of the present invention (including the second embodiment and the following embodiments), the short channel effect is desirably utilized. Namely, at the time of a write operation, a large short channel effect occurs and the threshold voltage Vth(W)ini in the non-written state becomes small, while at the time of a read operation, the short channel effect is made relatively small and thereby the threshold voltage Vth(R)ini in the non-written state at the time of a read operation taking the second level is made relatively high.

Making the short channel effect relatively large at the time of a write operation and relatively small at the time of a read operation is possible by just optimizing the voltage conditions at the time of operation. Note that, in the present embodiment, in order to further expand the optimal range of the voltage conditions or make the difference of degree of the short channel effect larger, desirably the basic structure of FIG. 1 is kept as it is and the structural parameters are optimized. Below, the method of optimization of the structural parameters will be described.

Experience shows that in a memory transistor having a certain channel length L, in order to cause the short channel effect, it is desirable to satisfy the following inequality (6):

$$L < A \cdot p^{1/3} \quad (6)$$

Here, "A" is an experimentally obtained coefficient, explained in detail later. Further, "P" is a parameter defined by the following equation (7) and depending upon a depth from the substrate surface (thickness of the drain region 4) serving as the channel of a bottom junction of the drain region 4 (refer to FIG. 1), a capacity C between the gate electrode 6 and the semiconductor substrate 2, and a channel impurity concentration Nb:

$$p(Xj,C,Nb) = Xj \cdot (\epsilon/C) \cdot (Ws(Nb) + Wd(Nb))^2 \quad (7)$$

Here, "$\epsilon$" is an effective dielectric constant of the substance present between the gate electrode 6 and the semiconductor substrate 2. Further, "Ws" is a width of a depletion layer extending from the source region 3 to the substrate side, and "Wd" is the width of a depletion layer extending from the drain region 4 to the substrate side.

The value of the coefficient "A" in the above inequality (6) is the coefficient when expressing the relationship between the parameter "p" defined by the above equation (7) and the channel length Lmin with which the short channel effect starts to occur by the following equation (8). The value of this coefficient "A" is found by experiments.

$$L\text{min} = A \cdot p^{1/3} \quad (8)$$

In the experiments for finding this coefficient "A", use is made of measurement results of samples of actually produced memory transistors and/or the results by simulation. It is possible to use the following two methods for judgment whether or not the short channel effect occurs at this time.

In the first method, the maximum channel length Lmin in the region where the short channel effect reliably occurs, is judged by the drain current. That is, when the structural parameters other than the channel length L are the same, if the channel length L is large, a drain current Id is proportional to a reciprocal of the channel length L. If the channel length L becomes short and the short channel effect starts to occur, the drain current Id becomes larger than a value proportional to 1/L. Therefore, the channel length L with which the drain current Id deviates from a value proportional to 1/L is defined as Lmin (channel length with which the short channel effect starts to occur). In the judgment of whether or not the drain current Id deviates from a value proportional to 1/L, for example, a case where the value of the drain current Id increases by 10% from a value proportional to 1/L is judged to be "deviating".

In the second method, the maximum channel length Lmin in the region where the short channel effect reliably occurs, is judged by a sub-threshold coefficient. That is, when the structural parameters other than the channel length L are the same, if the channel length L is large, the sub-threshold coefficient S does not depend upon the channel length L and is constant. However, if the channel length L becomes small, the value of the sub-threshold coefficient S gradually becomes larger. For example, if the value of the sub-threshold coefficient S increases by 10% compared with the case of a long channel, the channel length L at that time is defined as Lmin (channel length with which the short channel effect starts to occur). The sub-threshold coefficient S is defined in the following equation (9):

$$S = \Delta Vd / \Delta(\log_{10}(Id)) \quad (9)$$

Figure 2:
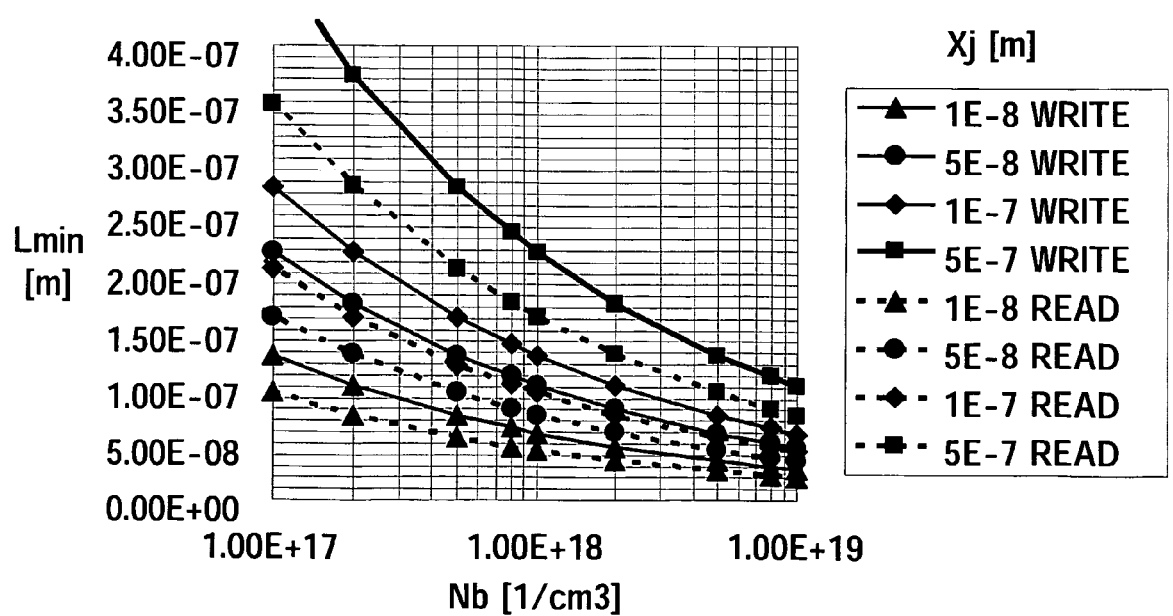
FIG. 2 is a graph showing a channel impurity concentration dependency of a channel length at which a short channel effect starts to occur.

FIG. 2 shows the channel impurity concentration Nb dependency of the channel length Lmin with which the short channel effect starts to occur at times of write and read operations. In FIG. 2, the results of calculation of the channel length Lmin with which the short channel effect starts to occur using equation (7) and equation (8) are plotted on the ordinate, and the channel impurity concentration (Nb) is plotted on the abscissa. FIG. 2 shows results of calculation (eight curves) when setting the value of the thickness Xj of the drain region 4 (refer to FIG. 1) at $1 \times 10^{-8}$ m, $5 \times 10^{-8}$ m, $1 \times 10^{-7}$ m, and $5 \times 10^{-7}$ m at the time of a write operation and the time of a read operation. At this time, the write drain voltage Vdw is set at 5V, and the read drain voltage Vdr is set at 0.5V. Further, at this calculation, use is made of the capacity when converting the stacked-layer film 5 to a 17 nm or so oxide film as the capacity C between the gate electrode 6 and the semiconductor substrate 2 (refer to FIG. 1).

It is seen from FIG. 2 that the channel length Lmin with which the short channel effect starts to occur differs between the time of a write operation and the time of a read operation even in the case of the same thickness Xj of the same drain region (that is, a memory transistor having the same structure). Accordingly, when setting the Lmin of an actual memory transistor (actual device) between the Lmin at the time of a write operation and the Lmin at the time of a read operation, it is possible to realize a device wherein a short channel effect occurs at the time of a write operation and does not occur at the time of a read operation. In addition, the difference between the Lmin at the time of a write operation and the Lmin at the time of a read operation (settable range of Lmin) depends upon the thickness Xj of the drain region. The thicker the drain region, the larger the expansion of the settable range of Lmin.

Next, the range able to be taken by the channel length L of an actual memory transistor will be shown by inequalities. The following inequalities (10-1) and (10-2) are derived from previous inequalities concerning the channel length in the case where the channel length L of the actual memory transistor is set in the settable range of Lmin evident from FIG. 2. When the channel length L of an actual memory transistor simultaneously satisfies the following inequalities (10-1) and (10-2), it becomes possible to realize a memory device wherein the threshold voltage in the non-written state at least at the time of a write operation is different from the threshold voltage in the non-written state at the time of a read operation.

$$L < A \cdot (Xj1 \cdot (\in/C) \cdot (Ws(Nb, Vdr)) + Wd(Nb, Vdr))^2)^{1/3} \quad (10\text{-}1)$$

$$L > A \cdot (Xj2 \cdot (\in/C) \cdot (Ws(Nb, Vdw)) + Wd(Nb, Vdw))^2)^{1/3} \quad (10\text{-}2)$$

Here, the source side depletion layer width Ws and the drain side depletion layer width Wd change depending upon the channel impurity concentration Nb and the read drain voltage Vdr or the write drain voltage Vdw. For this reason, inequality (10-1) and inequality (10-2) include the information of the channel impurity concentration and the voltage conditions. Further, the drain thickness Xj1 at the time of a read operation and the drain thickness Xj2 at the time of a write operation are treated as the thickness Xj of the common drain region so far as a symmetric memory transistor 1 (refer to FIG. 1) is used as in the present embodiment.

Figure 3:
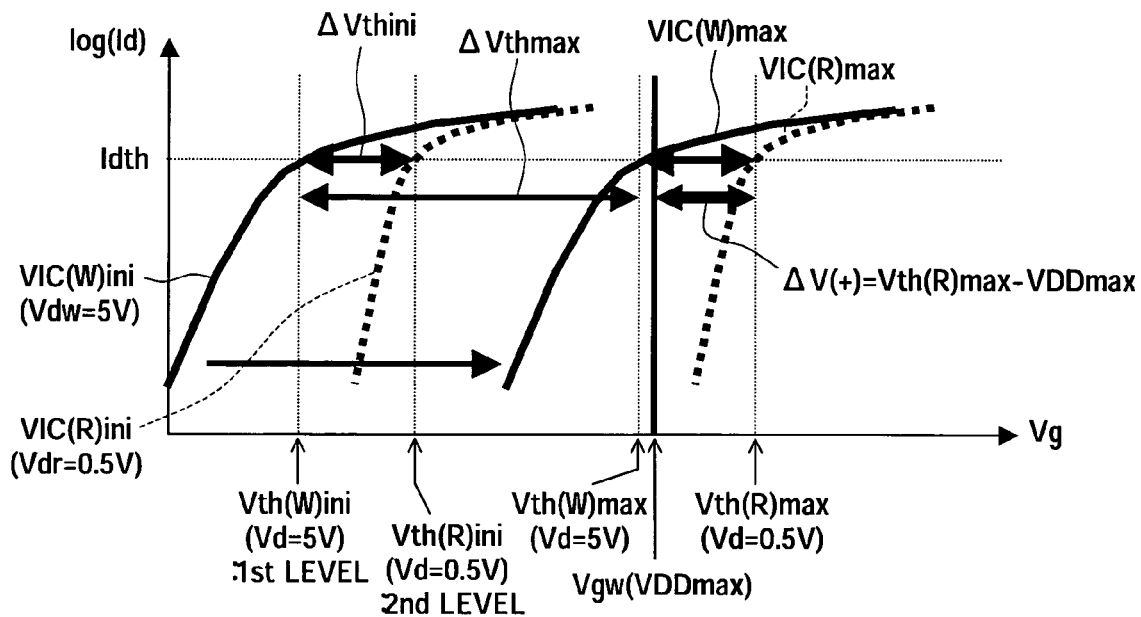
FIG. 3 is a graph for explaining an effect of a write operation on a graph of a Vg-Ig characteristic.

FIG. 3 is a graph for explaining the effect of the write operation explained up to here on a graph of the gate voltage Vg-drain voltage Ig characteristic. In FIG. 3, the threshold voltage is judged by a predetermined very small current Idth.

In FIG. 3, the solid lines indicate Vg-Ig characteristic curves (VIC(W)) where the short channel effect occurs due to application of a write drain voltage Vdw=5.0V. VIC(W)ini before writing changes to VIC(W)max after writing. The maximum threshold value change thereof is indicated by ΔVthmax.

Further, in FIG. 3, the broken (dotted) lines indicate Vg-Ig characteristic curves (VIC(R)) where the short channel effect does not occur by the application of a read drain voltage Vdr=0.5V. The difference between the Vg-Ig characteristic curve (VIC(R)ini) in the non-written state at the time of a read operation and the Vg-Ig characteristic curve (VIC(R)max) in the written state at the time of a read operation is substantially equal to the maximum threshold value change ΔVthmax described above at the time of a write operation.

The short channel effect does not occur by the application of the read drain voltage Vdr=0.5V, therefore, in the present embodiment, only a threshold voltage ΔVthini (difference of first and second levels) is generated by the application of the drain voltage Vdw=5.0V at the time of a write operation. The write operation starts from there. The write operation at this time is sufficiently performed up to near the write gate voltage Vgw (for example, the power voltage VDDmax).

In a memory transistor on which this write operation is performed, the characteristic indicated by VIC(R)max is obtained at the time of a read operation, while in a memory transistor on which no write operation is performed, the characteristic indicated by VIC(R)ini is obtained. As seen from FIG. 3, the threshold voltage Vth(R)max obtained from the characteristic IC(R)max of a memory transistor on which a write operation is performed has a value higher than the power voltage VDDmax by exactly a value indicated by ΔV(+). This shows that control of the threshold voltage up to higher than the maximum value of the supplied voltage is possible according to the present invention.

Note that while the channel length L was described as the structural parameter optimized for such a write operation, other structural parameters shown in equation (7) and in inequality (10-1) and inequality (10-2) are also closely related to the magnitude of the short channel effect, so desirably these structural parameters are also optimized. However, in the present embodiment, the memory transistor 1 has a symmetric structure at the source side and the drain side, therefore these structural parameters take substantially the same values between the time of a write operation and the time of a read operation. Accordingly, the optimization here becomes optimization changing the common values at the time of a write operation and the time of a read operation.

Second Embodiment

The second embodiment relates to the design of the structure of a memory transistor able to enlarge the settable range of the channel length and able to make the short channel effect at the time of a write operation further larger by that. Specifically, in the present embodiment, an asymmetric structure is given to the source side and the drain side of the memory transistor and the direction of the drain voltage is reversed at the time of a write operation and the time of a read operation so as to make the memory transistor operate reversing the asymmetry.

Note that, in the present embodiment, only the structure of the memory transistor and the direction of the drain voltage are different. The description concerning the basic operation described in the first embodiment and further the threshold voltage change and the gate length setting using equation (1) to inequality (10-1) and inequality (10-2) can be applied as is in the present embodiment.

The above equation (7), inequality (10-1), and inequality (10-2) include various types of parameters defining the channel length Lmin with which the short channel effect starts to occur. When the structural parameters at the time of a read operation at the right side of inequality (10-1) and the structural parameters at the time of a write operation at the right side of inequality (10-2) are changed unbalanced, and the change enables the enlargement of the setting range of the channel length L, it is also possible to make any structural parameter differ between the source side and the drain side.

Roughly classifying these parameters, there are parameters concerning the gate stacked-layer structure (e, C), and parameters concerning the substrate side structure (Xj1, Xj2, Ws, Wd, Nb). In the present invention, it is possible to change the parameters concerning the gate stacked-layer structure, the parameters concerning the substrate side structure, or both unbalanced at the time of a write operation and the time of a read operation.

It is possible to represent the parameters concerning the substrate side structure (∈, C) by the film thickness Tox when converting the stacked-layer film interposed between the gate electrode and the channel formation region to a silicon oxide film. On the other hand, among the parameters concerning the substrate side structure (Xj1, Xj2, Ws, Wd, Nb), the depletion layer widths Ws and Wd are not parameters able to be directly adjusted, but change according to the channel impurity concentration Nb. Accordingly, the structural parameters able to be adjusted here become the three types of parameters of the oxide film thickness Tox, the thicknesses of drains (depth of the bottom junction of the drain from the surface of the channel formation region) Xj1 and Xj2, and the channel impurity concentration Nb. When adding the voltage condition to them, the number of types of parameters able to be adjusted unbalanced at the time of a write operation and the time of a read operation in the present embodiment becomes four.

Below, as a typical example, the results of a study for changing the parameters concerning the substrate side structure unbalanced between the source side and the drain side (that is, at the time of a write operation and the time of a read operation) will be described. In order to achieve an enlargement (expansion) of the gate settable range, it is necessary to make the right side of the inequality (10-1) larger and make the right side of the inequality (10-2) smaller. That is, the drain thickness Xj1 at the time of a read operation is made smaller (thinner), and the drain thickness Xj2 at the time of a write operation is made larger (thicker). Further, the channel impurity concentration Nb is made higher on the drain side at the time of a write operation.

Explaining an example of setting (example of calculation) of such structural parameters, for example, in the case where the thicknesses of the source region and the drain region are the different $1.0 \times 10^{-7}$ m and $1.0 \times 10^{-8}$ m and the channel impurity concentration Nb is $1.0 \times 10^{-18}$ cm$^{-3}$, the channel length L is set within a range from $1.28 \times 10^{-7}$ m to $4.39 \times 10^{-8}$ m. In a memory transistor designed by this, the short channel effect appears (or becomes larger) when the thick impurity region is defined as the drain, and the short channel effect does not appear (or becomes smaller) when the shallow impurity region is defined as the drain.

At this time, in order to enlarge the difference of how the short channel effect appears when switching the drains, desirably the channel length L is set at the lower limit of the settable range, that is, near $4.39 \times 10^{-8}$ m. Note that, in this calculation, as the capacity C between the gate electrode and the substrate, use was made of a capacity when converting the stacked-layer film having the charge storage ability to a 17 nm or so oxide film.

Figure 4:
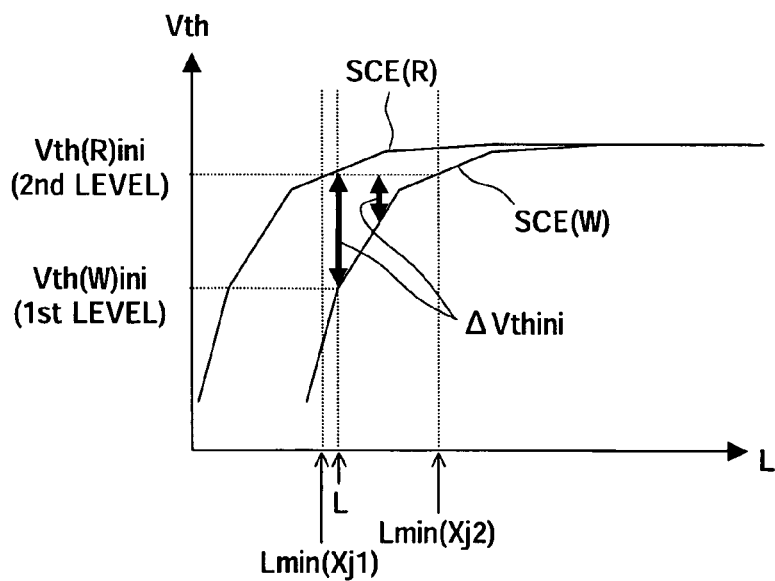
FIG. 4 is a graph showing a relationship between the channel length and a threshold voltage.

FIG. 4 is a graph showing the relationship between the channel length and the threshold voltage. In FIG. 4, a short channel effect curve indicated by notation SCE(R) indicates the characteristic at the time of a read operation when the shallow impurity region is used as the drain and the drain thickness Xj1 is set, while the short channel effect curve indicated by notation SCE(W) indicates the characteristic at the time of a write operation where the deep impurity region is used as the drain and the drain thickness Xj2 is set. As indicated by these two curves SCE(R) and SCE(W), at both of the time of a write operation and the time of a read operation, the shorter the channel length L, the lower the threshold voltage Vth. Note that the degree thereof (how to cause the short channel effect) is one where the curve SCE(W) at the time of a write operation becomes larger and the threshold voltage Vth becomes lower in comparison with the curve SCE(R) at the time of a read operation.

The channel length Lmin for estimating the start of occurrence of the short channel effect is defined by the location where the channel length falls 10% from the threshold voltage when the channel length was large. Accordingly, on the abscissa indicating the channel length, the range larger than Lmin (Xj1) but less than Lmin (Xj2) is the settable range of the channel length able to be taken by an actual memory transistor. As illustrated, when setting the actual channel length L near Lmin (Xj1) as the lower limit of this range, it is possible to obtain for example a large difference between the threshold voltage Vth(W)ini in the initial period of the time of a write operation (non-written state) and the threshold voltage Vth(R)ini in the non-written state at the time of a read operation, that is, the difference between the first level and the second level (threshold voltage difference in the initial period of writing) ΔVthini. Contrary to this, when obtaining the actual channel length L near the middle of the settable range, this threshold voltage difference ΔVthini in the initial period of the write operation becomes considerably small.

Further, as seen from FIG. 4, in order to enlarge (expand) the initial threshold voltage difference ΔVthini, desirably, particularly the drain thickness Xj1 at the time of a read operation is made smaller (thinner), and the lower limit value Lmin (Xj1) of the channel length setting range is made smaller. Alternatively, desirably the drain thickness Xj2 at the time of a write operation is made larger (thicker), and the upper limit value Lmin(Xj2) of the channel length setting range is made larger.

Figure 5:
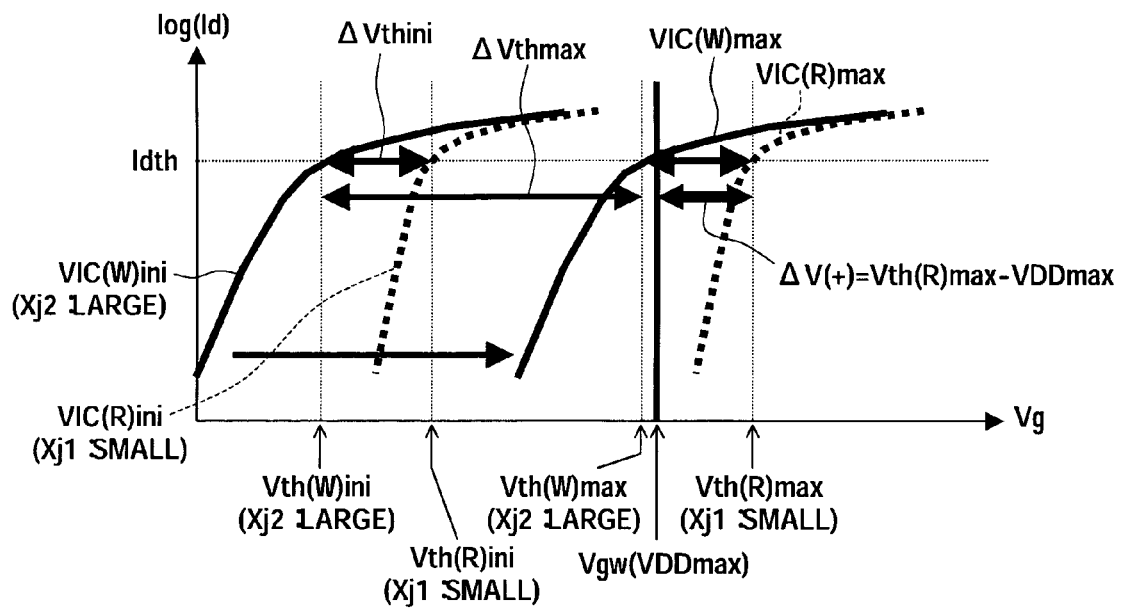
FIG. 5 is a graph for explaining an effect of a write operation when providing a difference in a drain thickness on a graph of the Vg-Ig characteristic.

FIG. 5 is a graph for explaining the effect of a write operation when providing a difference to the drain difference (Xj2>Xj1) on a graph of the Vg-Ig characteristic. This FIG. 5 is substantially the same as FIG. 3 showing the effect of the first embodiment. The explanation of notations is substantially the same as the description of FIG. 3. However, the parameters changed unbalanced at the time of a write operation and the time of a read operation are different. Namely, the solid curves VIC(W)ini and VIC(W)max shown in FIG. 3 indicate the time of a write operation when the write drain voltage Vdw=5.0V is applied, while the broken curves VIC(R)ini and VIC(R)max shown in FIG. 3 indicate the time of a read operation when the read drain voltage Vdr=0.5V is applied. Contrary to this, the solid curves VIC(W)ini and VIC(W)max shown in FIG. 5 indicate the time of a write operation when the drain thickness Xj2 is relatively large (thicker), while the broken curves VIC(R)ini and VIC(R)max shown in FIG. 5 indicate the time of a read operation when the drain thickness Xj1 is relatively small (thinner).

The threshold voltages shown in FIG. 3 and FIG. 5 behave substantially the same. This means that it is possible to further enlarge the effect of the drain voltage difference by providing a difference in the drain thickness. Accordingly, in the second embodiment, in addition to the application of the voltage condition shown in the first embodiment, by changing the structural parameters at the time of a read operation and the time of a write operation, it is possible to further enlarge (expand) the window from the first embodiment. As a result, it becomes possible to further enlarge the voltage margin at the time of a read operation, further enhance the long term reliability of the electrical characteristics, and further lower the voltage from the first embodiment.

Note that, in order to make the drain thickness Xj smaller (thinner), other than the method of physically making the impurity region shallower, there is the method of forming a MOS inversion layer in part of the channel formation region and using this as the source or drain. Further, in order to change the oxide film thickness Tox, the gate structure should be modified.

Structural examples able to be employed in the present embodiment including these methods and methods of formation thereof will be explained below. Here, an ONO type gate structure is used as an example. The possibility of application of other gate structures to the structural examples will be explained later. In the description of the structural examples, only the differences from FIG. 1 are referred to. The same configurations are given the same notations, and the descriptions thereof are omitted. Further, the production conditions and materials here are examples. The invention is not limited to these description.

STRUCTURAL EXAMPLE 1

Structural Example 1 relates to a device structure forming two second conductivity type regions (S/D impurity regions) having different depths by impurity diffusion layers.

Figure 6:
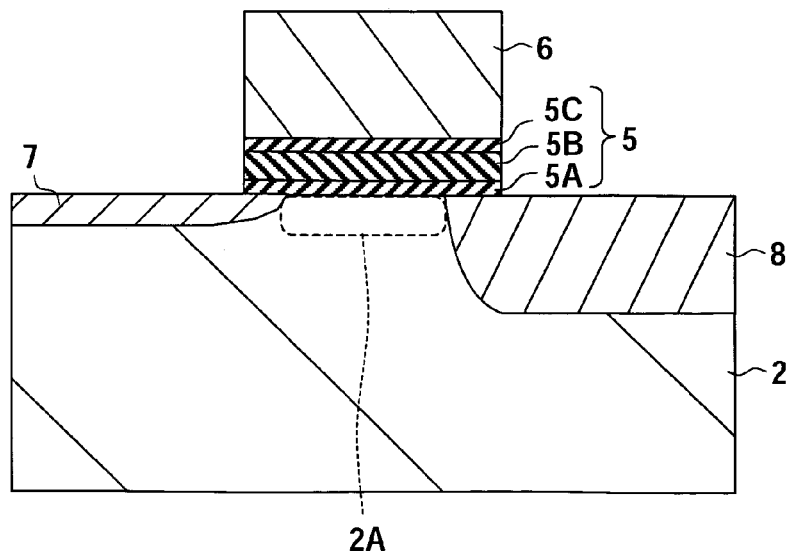
FIG. 6 is a sectional view of a memory transistor of a Structural Example 1.

FIG. 6 is a sectional view of a memory transistor of Structural Example 1. In the first embodiment, the source region 3 and the drain region 4 are simultaneously formed, therefore they have substantially equal thicknesses (depths of the bottom junction from the surface of the channel formation region 2A) (refer to FIG. 1). Here, one of the two S/D impurity regions 7 and 8 corresponding to the source region 3 and the drain region 4, i.e., here, the S/D impurity region 8, is made thicker. The thick S/D impurity region 8 functions as the drain at the time of a write operation, and the thin S/D impurity region 7 functions as the drain at the time of a read operation.

Figure 7A:
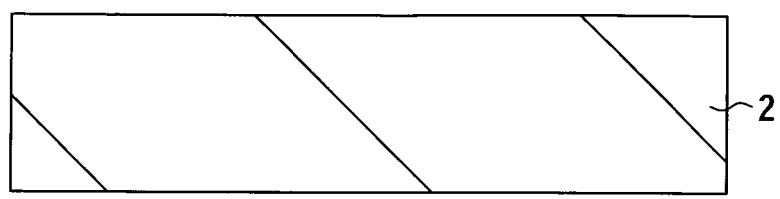
FIGS. 7A to 7C are sectional views showing the state up to formation of a resist for isolating elements at the time of formation of Structural Example 1.
Figure 7B:
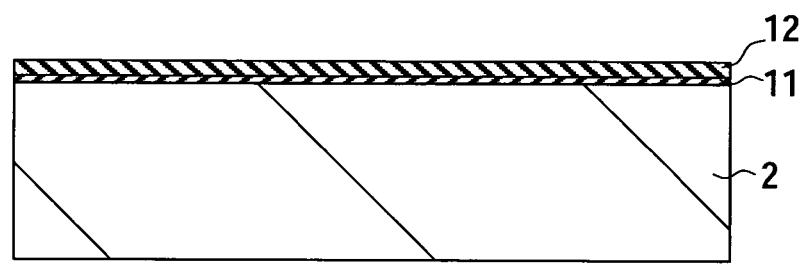
Figure 7C:
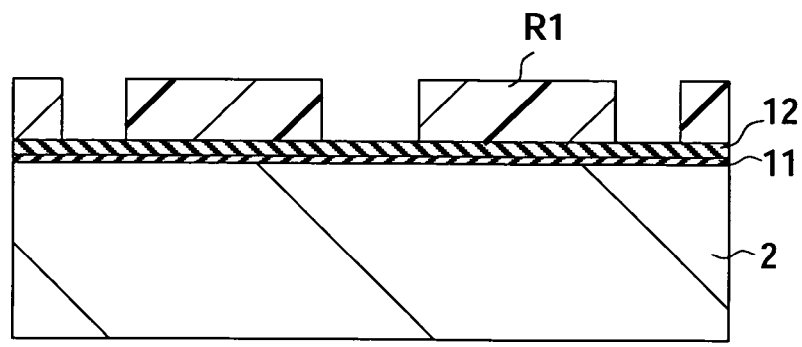

FIGS. 7A to 7C to FIGS. 11A to 11C are sectional views of states in the formation of Structural Example 1. First, in the steps corresponding to FIG. 7A to FIG. 7C, element isolation is performed by shallow trench isolation (STI). That is, the prepared semiconductor substrate 2 is washed (FIG. 7A), then the substrate surface is thermally oxidized to form a pad oxide film 11 of 100 nm, then an etching protection film 12 made of a nitride film of 150 nm is deposited by chemical vapor deposition (CVD) (FIG. 7B). The etching protection film 12 is formed with a resist R1 opened at the element isolation portion (FIG. 7C). Thereafter, although not particularly illustrated, the etching protection film 12 and the pad oxide film 11 at the portion exposed at the opening of the resist R1 are etched away, then the silicon is etched to form a shallow groove (trench). Thereafter, the resist R1 is removed and the interior of the trench is buried by an insulating substance, then the surface is flattened.

Figure 8A:
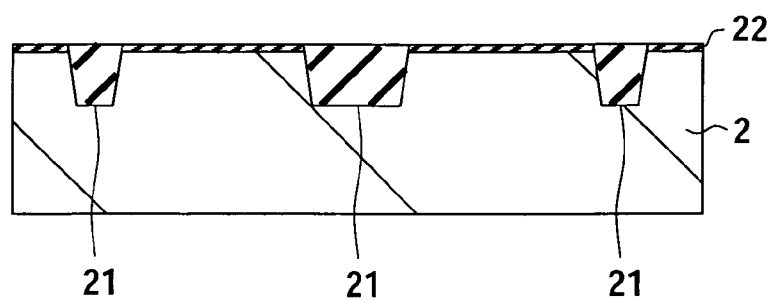
FIGS. 8A and 8B are sectional views continued from FIG. 7C showing the state up to formation of a well.
Figure 8B:
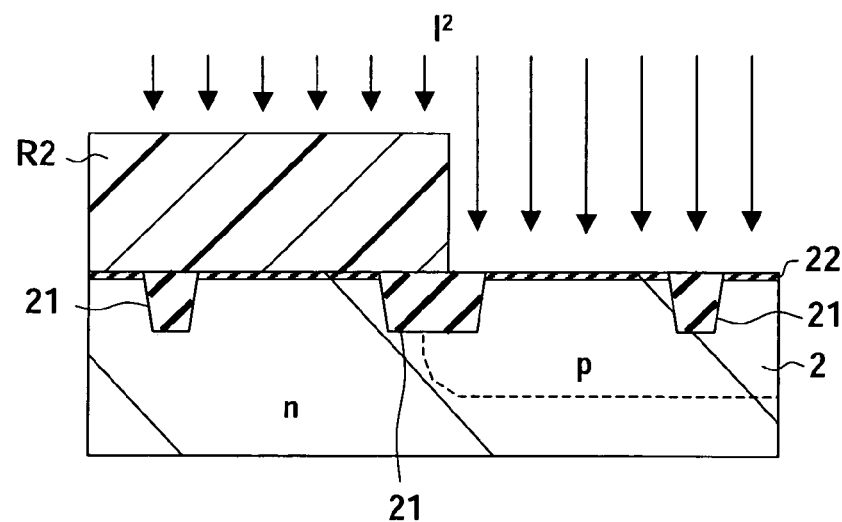

At the steps corresponding to FIG. 8A and FIG. 8B, a well is formed in the semiconductor substrate. That is, the surface of the semiconductor substrate 2 formed with an element isolation insulation layer 21 by the above-described method is washed, then a through film 22 of 30 nm is formed by thermal oxidation (FIG. 8A). Next, a well is formed by a step corresponding to FIG. 8B. In the case of a combination non-volatile memory, P-wells and N-wells are sequentially formed in the logic circuit portion and the memory circuit portion. The wells are formed differing in only the impurity and ion implantation process and become substantially the same processes. FIG. 8B shows the time of the formation of a P-well after the formation of an N-well of a memory circuit as an example. In the formation of the N-well (displayed by "n" in the figure), phosphorus ions are implanted under conditions of 1 MeV and $5 \times 10^{12}$ cm$^{-2}$. When a P-well (displayed as "p" by the broken line in the figure) is formed in the N-well, a resist R2 for protecting the parts of the N-well on which the P-well is not to be formed is formed on the through film 22, and ions of the P-type impurity (boron) are implanted through the through film 22 using this as a mask. The ion implantation here is performed two times in order to adjust the profile. The first conditions are 190 KeV and $6 \times 10^{12}$ cm$^{-2}$, and the second conditions are 90 KeV and $5 \times 10^{12}$ cm$^{-2}$. After this, the resist R2 is removed.

Figure 9A:
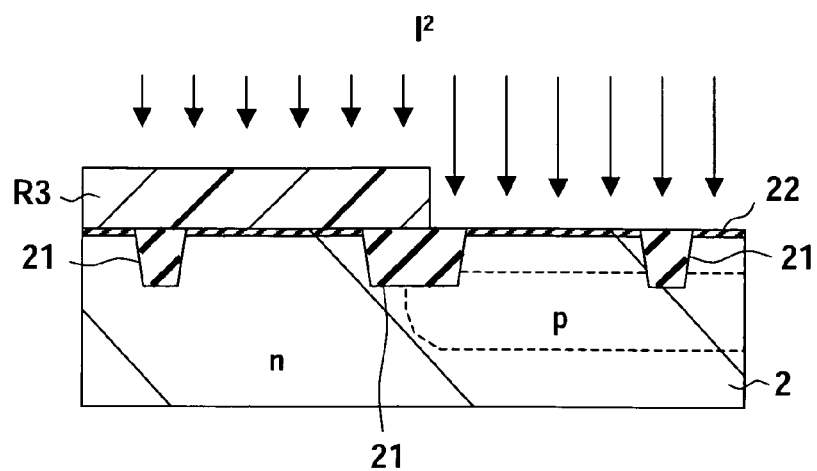
FIGS. 9A and 9B are sectional views continued from FIG. 8B showing the state up to formation of an ONO film.
Figure 9B:
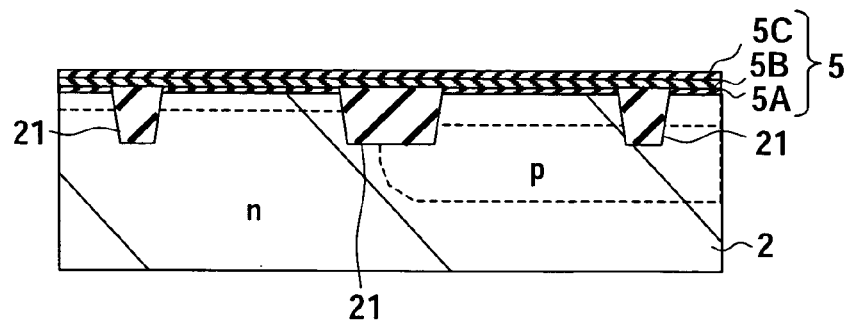

At the steps corresponding to FIG. 9A and FIG. 9B, the channel impurity is doped and the ONO film is formed. That is, a resist R3 is formed, then the channel impurity is doped by ion implantation using this as the mask to adjust the threshold voltage (FIG. 9A). The ion implantation is performed two times. The conditions thereof are 60 KeV and $1 \times 10^{12}$ cm$^{-2}$ for the first time, and 15 KeV and $4 \times 10^{11}$ cm$^{-2}$ for the second time. The resist R3 is removed, then the result is washed and annealed for activation of the doped impurity (heat treatment in an inert gas). Thereafter, the through film 22 and a natural oxide film are removed by wet etching, the substrate surface is washed, then an ONO film 5 is formed (FIG. 9B). In the formation of the ONO film 5, the substrate surface is thermally oxidized, a first oxide film (so-called "bottom oxide film") 5A of 8 nm is formed, and a nitride film 5B of 8 nm is deposited on that by CVD. Then, this nitride film 5B is thermally oxidized on its surface or a second oxide film (so-called "top oxide film") 5C of 8 to 9 nm is formed by CVD. The second oxide film 5C finally becomes 5 to 6 nm.

Figure 10A:
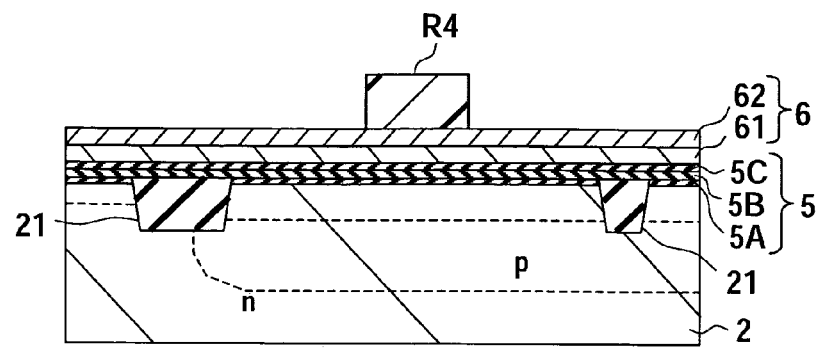
FIGS. 10A to 10C are sectional views continued from FIG. 9B showing the state up to formation of a gate electrode.
Figure 10B:
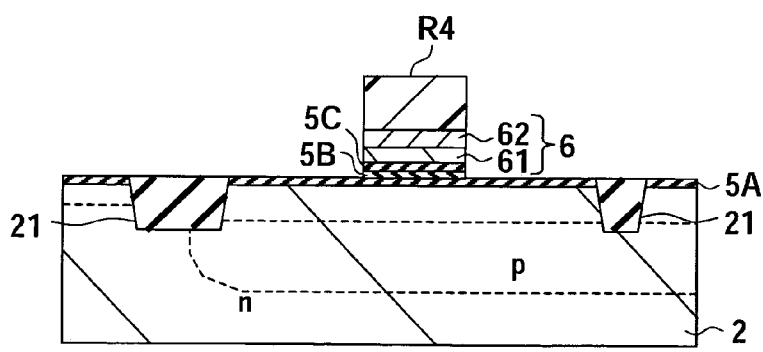
Figure 10C:
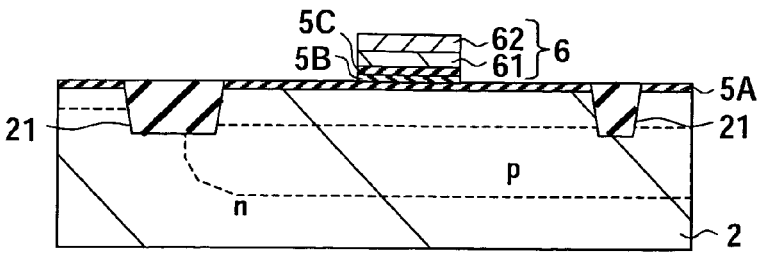

In the steps corresponding to FIG. 10A to FIG. 10C, a gate electrode is formed. That is, the assembly is washed, then phosphorus-doped polysilicon 61 of 100 nm is deposited, then tungsten(w) is formed and converted into a silicide by heating. A resist R4 having a gate pattern is formed on tungsten silicide 62 formed by this (FIG. 10A). The tungsten silicide 62, the phosphorus-doped polysilicon 61, and further the second oxide film 5C and the nitride film 5B are sequentially etched by dry etching using the resist R4 as a mask (FIG. 10B). Thereafter, the resist R4 is removed (FIG. 10C).

Figure 11A:
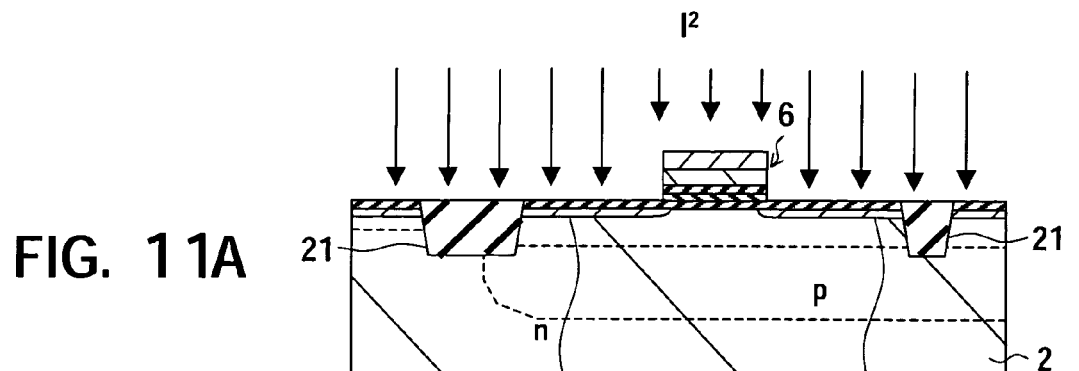
FIGS. 11A to 11C are sectional views continued from FIG. 10C showing the state up to formation of two S/D impurity regions.
Figure 11B:
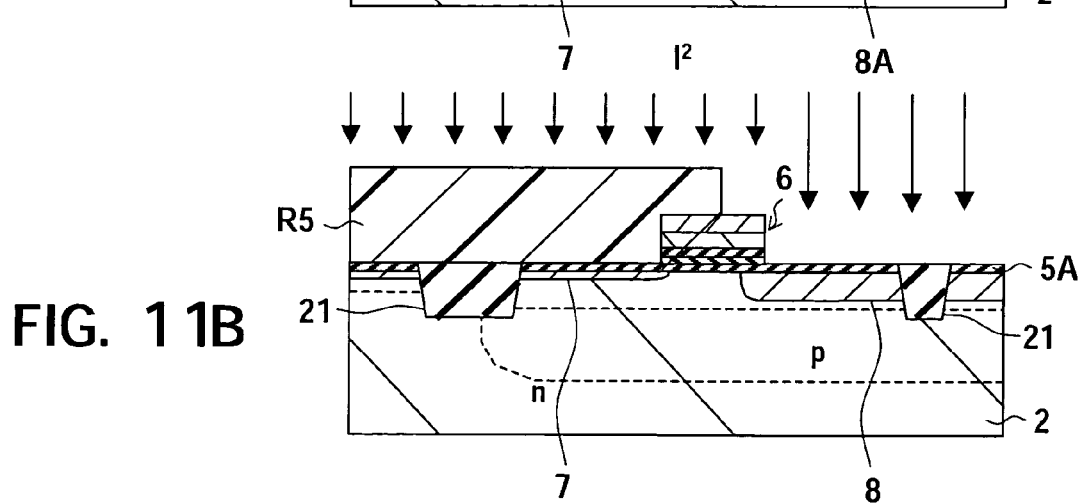
Figure 11C:
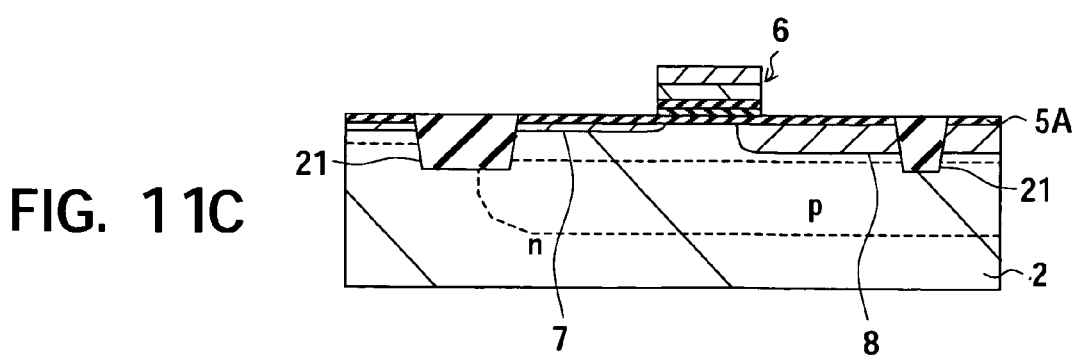

In the steps corresponding to FIG. 11A to FIG. 1C, two S/D impurity regions 7 and 8 are formed. Note that here, the S/D impurity region 7 is formed earlier, but it is also possible to conversely form the S/D impurity region 8 earlier. That is, first, in order to form the shallow S/D impurity region 7, arsenic ions are implanted using the gate electrode 6 as a self alignment mask (FIG. 11A). The ion implantation conditions are 10 Kev and $1 \times 10^{15}$ cm$^{-2}$. Due to this, relatively high concentration and shallow S/D impurity regions 7 and 8A are formed at the surface of the P-well at the two sides of the gate electrode 6. A resist R5 for protecting the S/D impurity region 7 is formed, then phosphorus ions are implanted using this as a mask (FIG. 11B). The ion implantation conditions are 40 KeV and $1 \times 10^{15}$ cm$^{-2}$. Due to this, the relatively high concentration and deep S/D impurity region 8 is formed at the surface of the P-well at one side of the gate electrode 6. The resist R5 is removed, the result washed, then annealed for activation of the doped impurity (heat treatment in inert gas). The annealing conditions are 950° C. and 10 seconds. This completes the memory transistor of Structural Example 1 shown in FIG. 6.

STRUCTURAL EXAMPLES 2 AND 3

Structural Example 2 relates to a device structure realized by a structure elevating a shallow S/D impurity region. Further, Structural Example 3 relates to a device structure having a Schottky junction in place of the shallow S/D impurity region.

Figure 12:
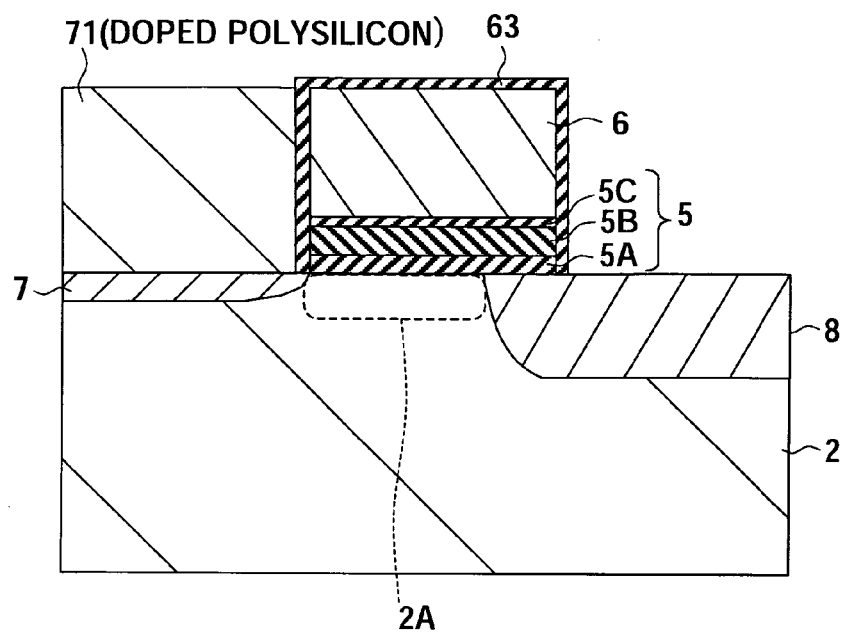
FIG. 12 is a sectional view of a memory transistor of a Structural Example 2.
Figure 13:
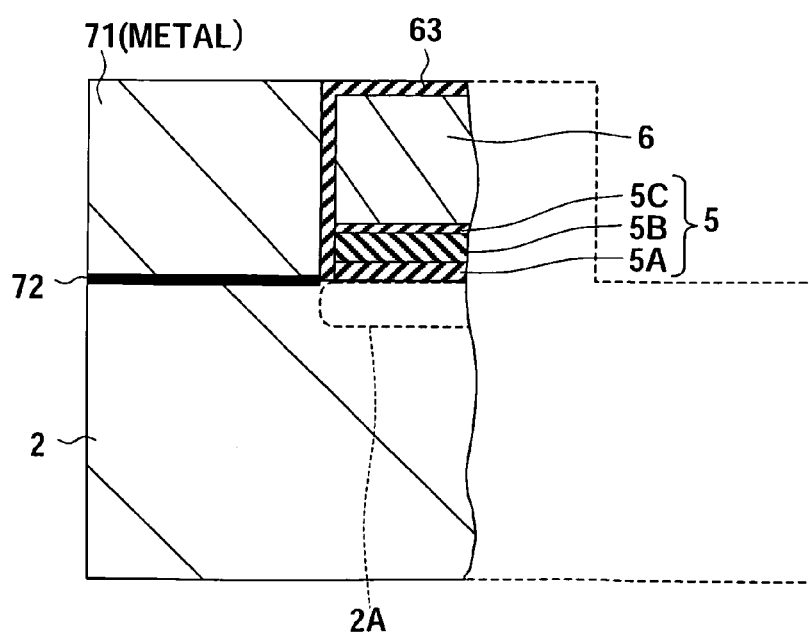
FIG. 13 is a sectional view of a memory transistor of a Structural Example 3.

FIG. 12 is a sectional view of a memory transistor of Structural Example 2. Further, FIG. 13 is a sectional view of a memory transistor of Structural Example 3. Note that the side (portion of the broken line) not illustrated in FIG. 13 may be made any structure. It may be made a deep S/D impurity region 8 in the same way as FIG. 12 or may be a shallow S/D impurity region. Further, it may be a structure formed by another structural example mentioned later.

In Structural Examples 2 and 3, the surfaces where the gate electrode 6 and the stacked-layer film 5 appear are covered by an insulation film 63. Further, both of the structural examples have a conductive layer 71 contacting the surface of the semiconductor substrate 2 on the side where the shallow S/D impurity region is to be formed and electrically isolated from the gate electrode 6 by the insulation film 63. The conductive layer 71 is constituted by doped polysilicon formed by doping an N-type impurity at a high concentration in the case of Structural Example 2 (FIG. 12) and constituted by a metal in the case of Structural Example 3 (FIG. 13).

Accordingly, in Structural Example 2, the N-type impurity is diffused in the substrate surface by heat treatment or heat diffusion using the conductive layer 71 as the diffusion source in heat history. A thin S/D impurity region 7 is formed as a result of this. On the other hand, in the case of Structural Example 3, a Schottky junction 72 is formed in place of the thin S/D impurity region 7. This functions as the drain at the time of a read operation.

FIG. 14A to FIG. 15B are sectional views of states during the formation of Structural Examples 2 and 3. They are the same as Structural Example 1 up to the formation of the gate electrode (FIG. 10C), therefore the explanation will be omitted here.

Figure 14A:
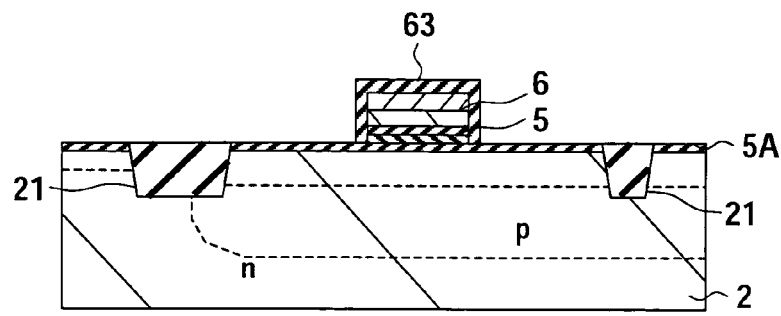
FIGS. 14A and 14B are sectional views showing the state up to formation of a deep S/D impurity region at the time of formation of Structural Examples 2 and 3.
Figure 14B:
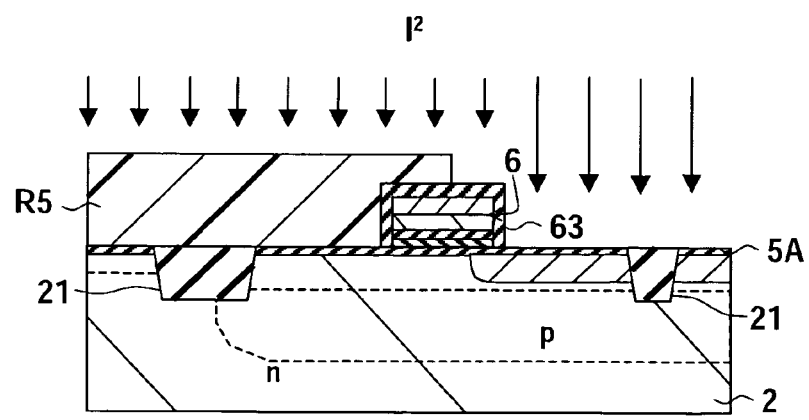

The exposed parts (top surface and side surfaces) of the gate electrode 6 and the stacked-layer film 5 are covered by the insulation film 63 (FIG. 14A), a resist R5 is formed protecting the part where the shallow S/D impurity region is predicted to be formed, and the N-type impurity ions are implanted using this as a mask (FIG. 14B). The ion implantation conditions at this time are the same as the time of FIG. 11B. Note that after that, it is necessary to remove the resist R5, then remove the oxide film 5A around the gate electrode.

Figure 15A:
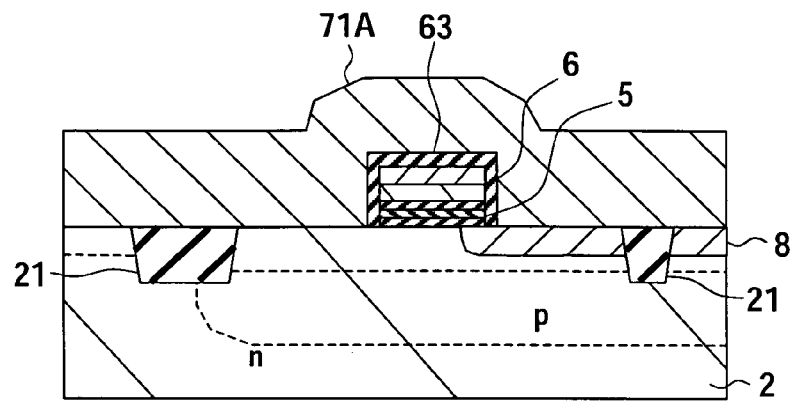
FIGS. 15A and 15B are sectional views continued from FIG. 14B showing the state up to formation of a conductive layer.
Figure 15B:
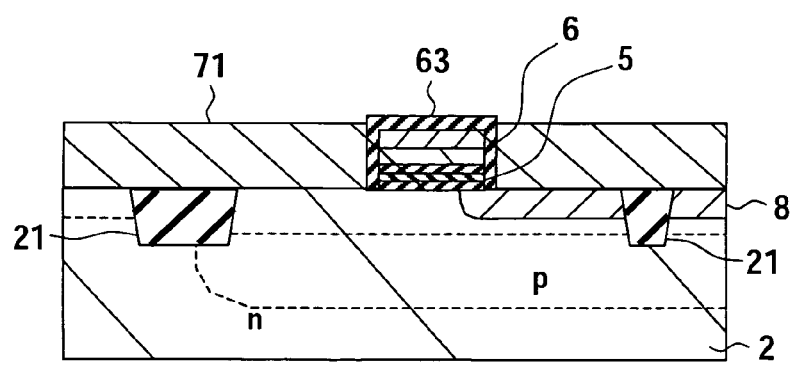

Next, the exposed substrate surface is washed and annealed for activation, then a conductive film 71A made of doped polysilicon or a metal is deposited thick (FIG. 15A). When the conductive film 71A is doped polysilicon, a P-type impurity is diffused in the substrate by heat treatment to form the S/D impurity region 7 (not illustrated). The heat treatment is not necessary in the case where the conductive film 71A is made of a metal. The surface of the conductive film 71A is flattened by chemical mechanical polishing (CMP), the conductive film 71A is isolated at both sides of the gate, and thereby a conductive layer 71 is formed (FIG. 15B). Thereafter, although not particularly illustrated, the unnecessary parts of the conductive layer are removed by lithography and dry etching.

STRUCTURAL EXAMPLE 4

Structural Example 4 relates to a device structure providing a step in order to position the bottom junction of the deep S/D impurity region 8 in a further deep portion of the substrate.

Figure 16:
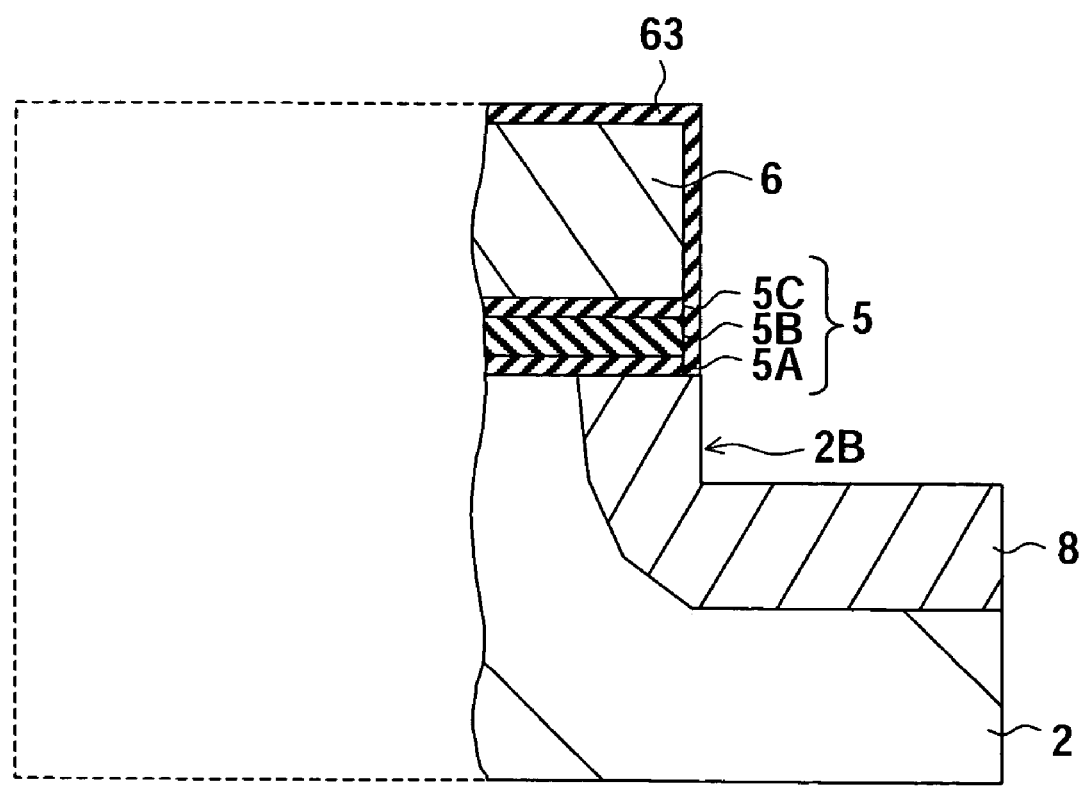
FIG. 16 is a sectional view of a memory transistor of a Structural Example 4.

FIG. 16 is a sectional view of a memory transistor of Structural Example 4. Note that the side (portion of the broken line) not illustrated in FIG. 16 may be made any structure. It is possible to employ the structure of any of the other examples. In Structural Example 4, the semiconductor substrate 2 is etched on one side of the gate electrode 6, whereby a step 2B is formed. It is possible to control this step 2B by the etching time. A deep S/D impurity region 8 is formed in this step portion.

Figure 17A:
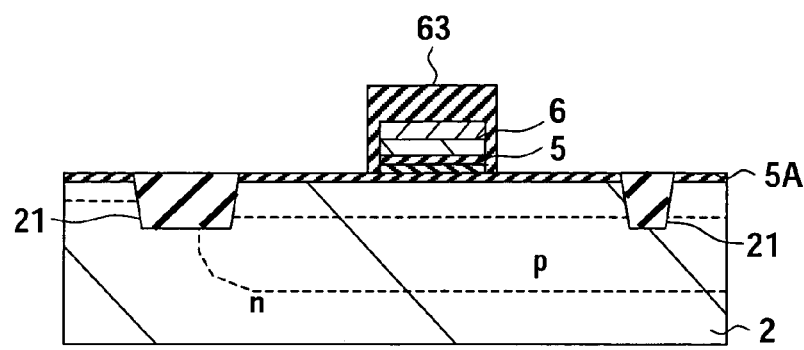
FIGS. 17A and 17B are sectional views showing the state up to formation of a step at the time of formation of Structural Example 4.

FIGS. 17A and 17B to FIGS. 18A and 18B are sectional views of states during the formation of Structural Example 4. They are the same as Structural Example 1 up to the formation of the gate electrode (FIG. 10C), so the explanation will be omitted here. The insulation film 63 is formed in the same way as Structural Examples 2 and 3 (FIG. 17A). However, this insulation film 63 functions also as an etching protection film, therefore desirably it is made thick to a certain extent by a material having a high dry etching tolerance.

Figure 17B:
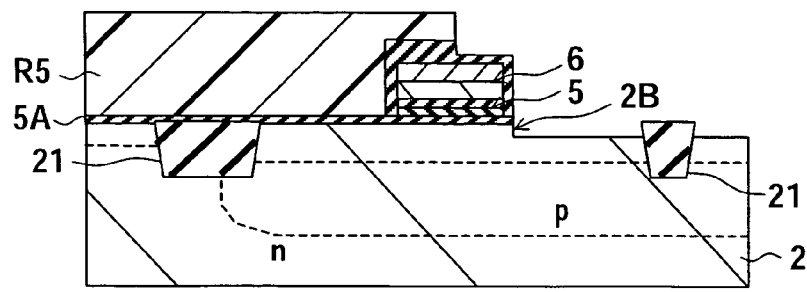
Figure 18A:
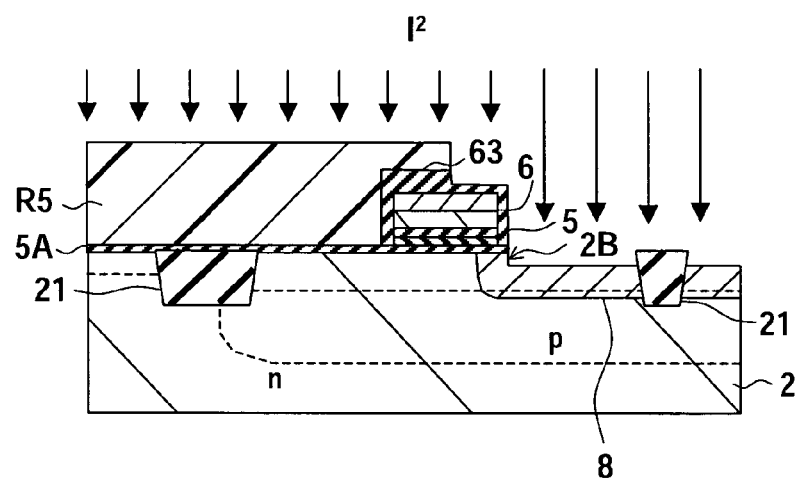
FIGS. 18A and 18B are sectional views continued from FIG. 17B showing the state up to formation of a shallow S/D impurity region.
Figure 18B:
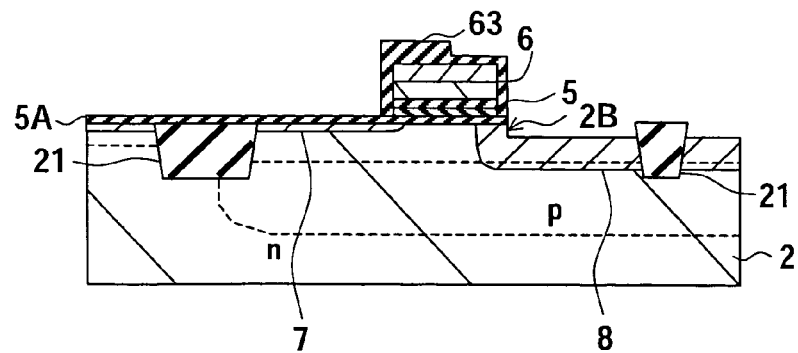

A resist R5 is formed for protecting the part where the shallow S/D impurity region is scheduled to be formed, then dry etching is performed using this as a mask to thereby form a step 2B in the semiconductor substrate 2 (FIG. 17B). Further, N-type impurity ions are implanted using the resist R5 as a mask (FIG. 18A). The ion implantation conditions at this time are the same as those at the time of FIG. 11B or may be changed in accordance with the depth of the step 2B. The resist R5 is then removed and ion implantation performed to form the shallow S/D impurity region 7 (FIG. 18B). The ion implantation conditions at this time are made the same as those at the time of FIG. 11A.

STRUCTURAL EXAMPLE 5

Figure 19:
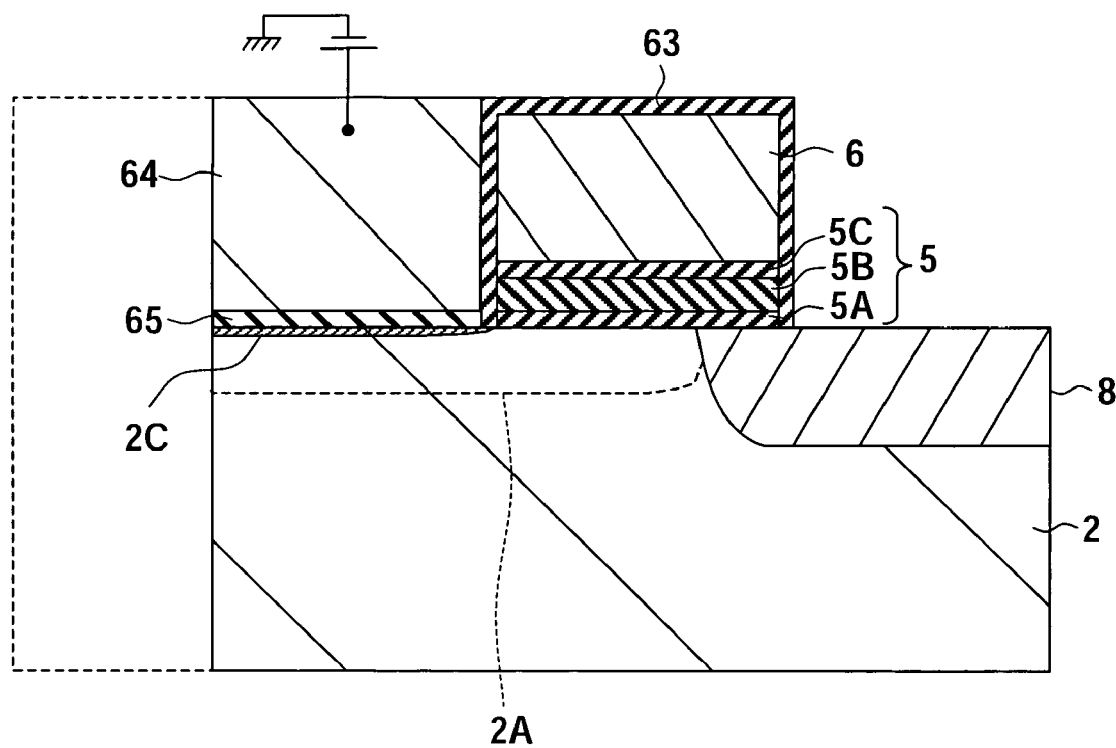
FIG. 19 is a sectional view of a memory transistor of Structural Example 5.

Structural Example 5 relates to a device structure where a MOS inversion layer is induced at part of the channel formation region and is given the same role as that of the shallow S/D impurity region 7. FIG. 19 is a sectional view of a memory transistor of Structural Example 5. Note that the S/D impurity region at the side (portion of the broken line) not illustrated in FIG. 19 may be made any structure. It is possible to employ the structure of any of the other examples.

In Structural Example 5, the part of the channel formation region 2A on the deep S/D impurity region 8 side is formed with a gate electrode 6 and a stacked-layer film 5 covered by an insulation film 63 in the same way as Structural Example 4. The adjacent part thereof is then formed with a second gate electrode 64 over the part of the channel formation region 2A via a gate oxide film 65. This second gate electrode 64 is an electrode for inducing the MOS inversion layer 2C at the part of the channel formation region 2A at the time of biasing. When the MOS inversion layer 2C is induced, irrespective of the structure of the not illustrated portion of the broken line, this part functions as an extremely thin source or drain. Note that, as the gate oxide film 65, it is possible to leave a first oxide film 5A of the ONO film 5, the insulation film 63, or both for use. Also, a film newly formed separately from them may be used.

This inversion layer has an extremely small (thin) thickness compared with the shallow second conductivity type region (S/D impurity region) formed by doping the impurity explained hitherto and becomes the shallowest second conductivity type region able to be realized. Accordingly, at the time of a read operation when this is used as the drain, it is possible to further suppress the short channel effect. By this, it is possible to make the difference from the short channel effect occurring when the deep second conductivity type region (S/D impurity region) 8 is used as a drain larger. As a result, there is the advantage that the effects of the present invention explained up to here are further raised.

Figure 20A:
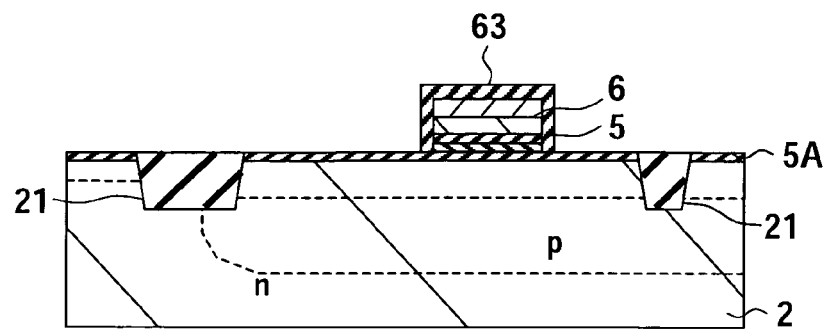
FIGS. 20A and 20B are sectional views showing the state up to formation of a resist of a gate pattern at the time of formation of Structural Example 5.
Figure 20B:
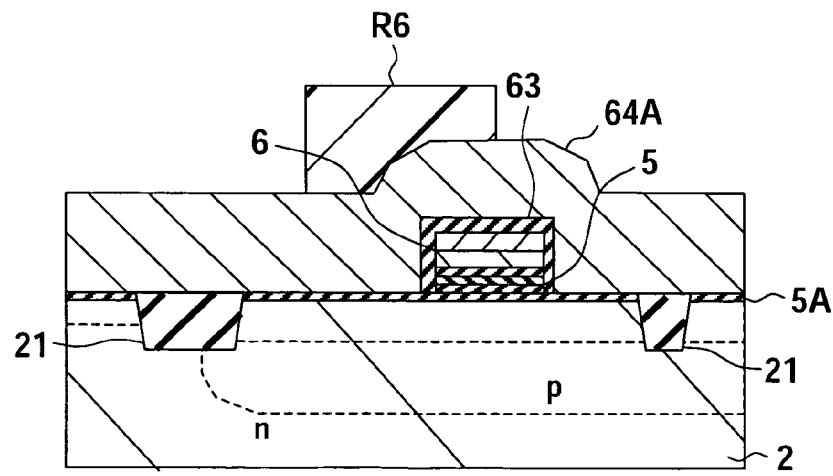

Below, the method of formation of Structural Example 5 will be explained with reference to the case where the same film as the first oxide film 5A is utilized as the gate oxide film 65. FIGS. 20A and 20B to FIGS. 21A and 21B are sectional views of states during the formation of Structural Example 5. They are the same as in Structural Example 1 up to the formation of the gate electrode (FIG. 10C), so the explanation will be omitted here. An insulation film 63 is formed in the same way as the cases of Structural Examples 2 and 3 (FIG. 20A). A conductive film 64A made of doped polysilicon or a metal is deposited thick, then a resist R6 having a pattern partially overlapping the gate electrode 6 is formed over that (FIG. 20B).

Figure 21A:
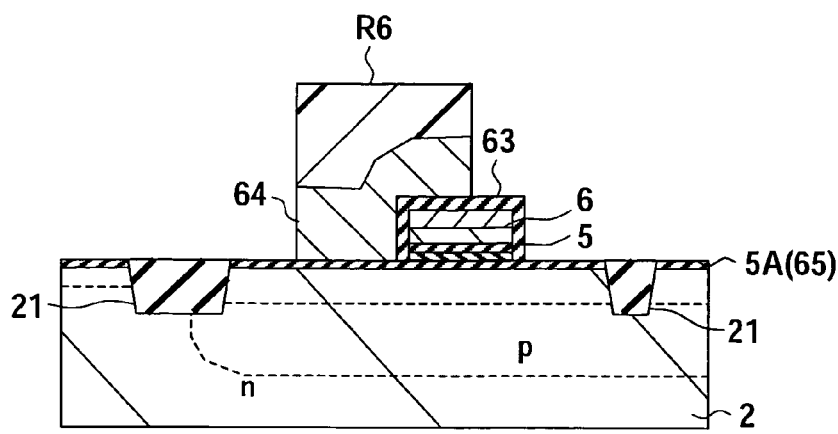
FIGS. 21A and 21B are sectional views continued from FIG. 20B showing the state up to formation of a shallow S/D impurity region.
Figure 21B:
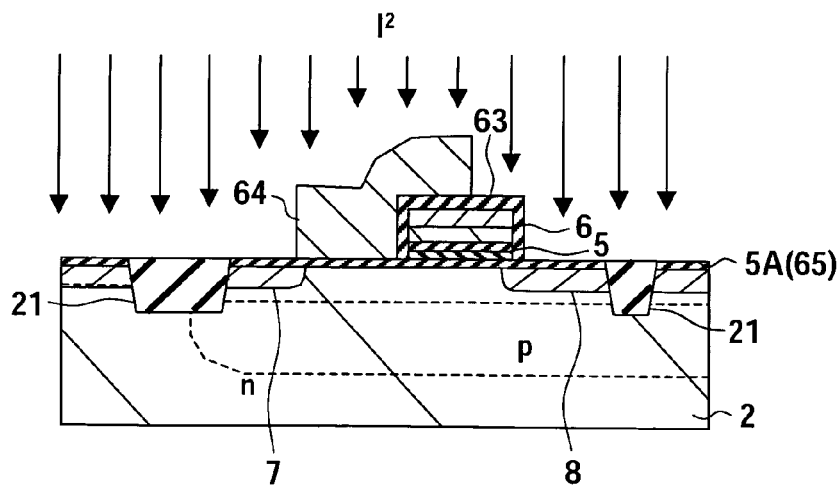

By dry etching etc. using the resist R6 as a mask, the unnecessary conductive film 64A around the resist R6 is removed to form the second gate electrode 64 (FIG. 21A). The resist R6 is removed, then ion implantation of the N-type impurity using the two gate electrodes 6 and 64 as self alignment masks is performed to simultaneously form the two S/D impurity regions 7 and 8 (FIG. 21B). As the ion implantation conditions at this time, it is desirable to use the conditions for a deep S/D impurity region the same as those at the time of FIG. 11B. Thereafter, the assembly is washed, then annealed for activation to complete Structural Example 5.

STRUCTURAL EXAMPLE 6

Figure 22:
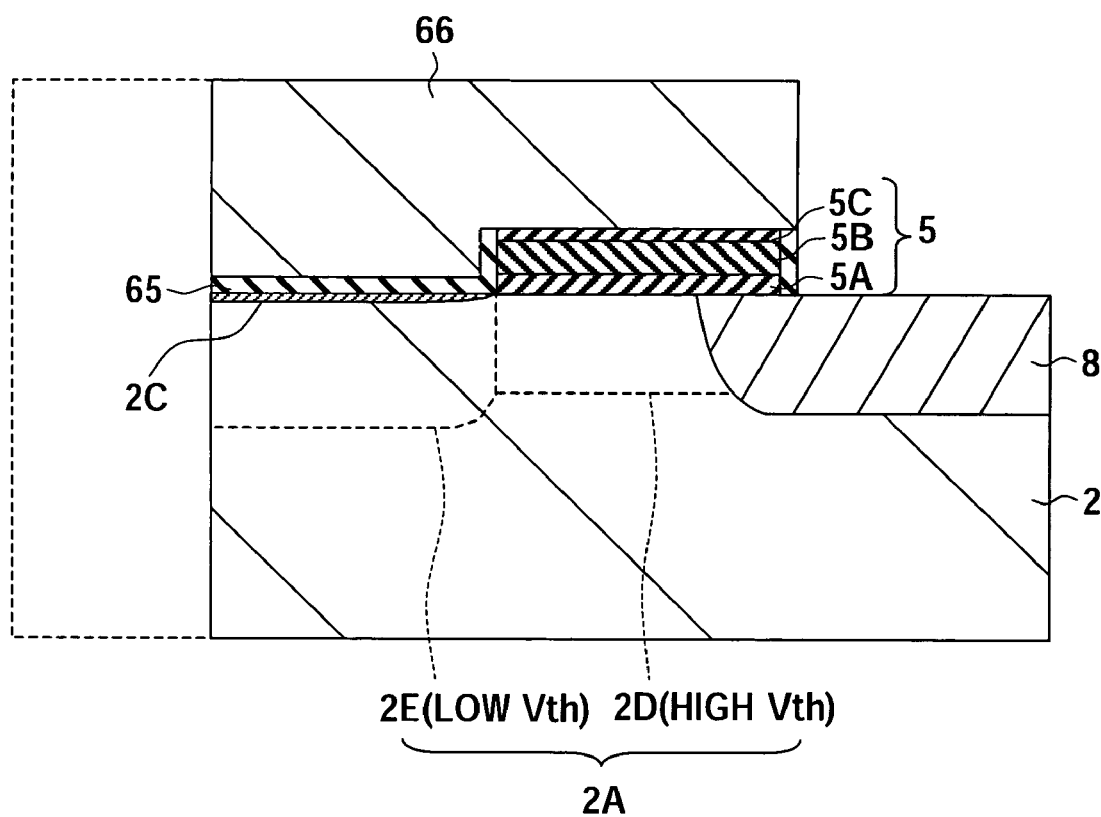
FIG. 22 is a sectional view of a memory transistor of a Structural Example 6.

Structural Example 6 is a case where the two gate electrodes 6 and 64 in Structural Example 5 are changed to a common gate electrode 66. By such a change, only a common gate voltage is formed, therefore, in order to induce the MOS inversion layer in the part of the channel formation region, it is necessary to change the impurity concentration of the channel formation region between the part for inducing the MOS inversion layer and the part not inducing the same. FIG. 22 is a sectional view of a memory transistor of Structural Example 6. Note that the S/D impurity region at the side (portion of the broken line) not illustrated in FIG. 22 may be made any structure. It is possible to employ the structure of any of the other examples.

In FIG. 22, the channel formation region 2A is constituted by a high threshold voltage (Vth) region 2D on the deep S/D impurity region 8 side and a low Vth region 2E adjacent to that. The high Vth region 2D is formed with a stacked-layer film 5 having an ONO structure, while the low Vth region 2E is formed with a single layer of gate oxide film 65. Note that, as the gate oxide film 65, it is also possible to leave the first oxide film 5A of the ONO film 5, the insulation film 63, or both for use. It is also possible to use a film newly formed separately from them. A common gate electrode 66 is formed on the gate oxide film 65 and the stacked-layer film 5.

Below, the method of forming Structural Example 6 will be explained by reference to for example a case where the same film as the first oxide film 5A is used as the gate oxide film 65. FIG. 23A to FIG. 25B are sectional views of states during the formation of Structural Example 6. They are the same as in Structural Example 1 up to the formation of the ONO film (stacked-layer film) 5 (FIG. 9B), so the explanation will be omitted here.

Figure 23A:
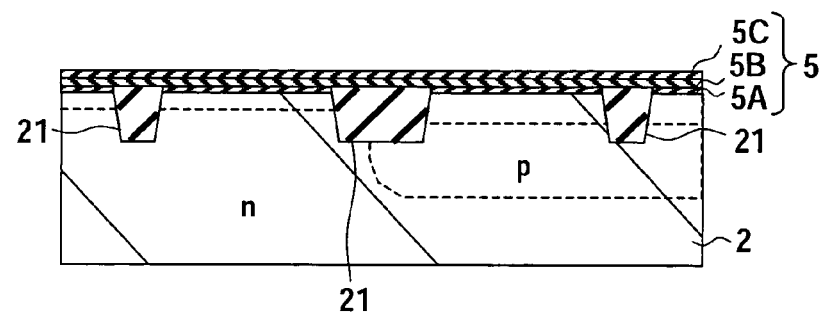
FIGS. 23A and 23B are sectional views showing the state up to formation of a low Vth region at the time of formation of Structural Example 6.
Figure 23B:
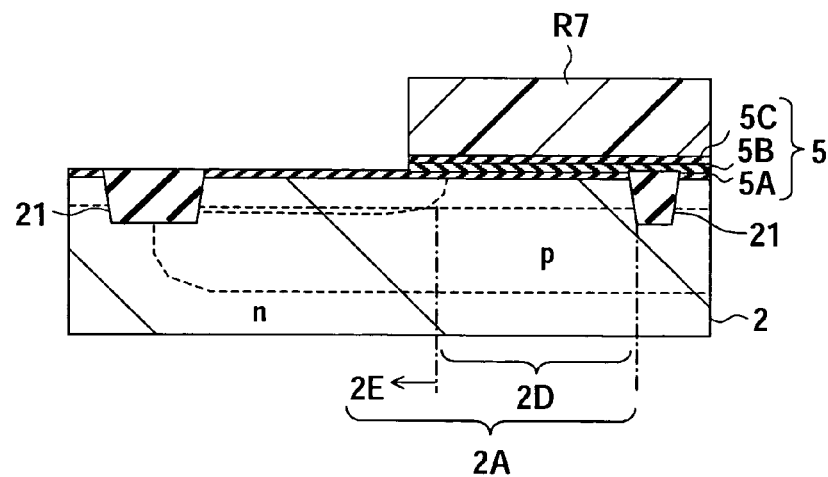

A stacked-layer film 5 (FIG. 23A) is formed, then a resist R7 is formed and the second oxide film 5C and the nitride film 5B are removed by etching using this as a mask, then ion implantation is performed for a second threshold voltage adjustment for defining the impurity concentration of the low Vth region 2E. Due to this, the channel formation region 2A is divided to a low Vth region 2E and a high Vth region 2D (FIG. 23B). Thereafter, the resist R7 is removed.

Figure 24A:
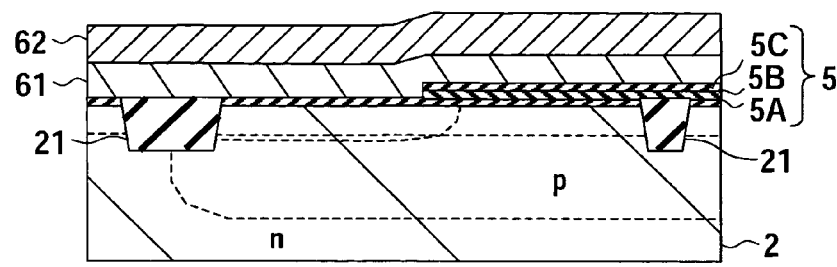
FIGS. 24A and 24B are sectional views continued from FIG. 23B showing the state up to formation of a resist of a gate pattern.
Figure 24B:
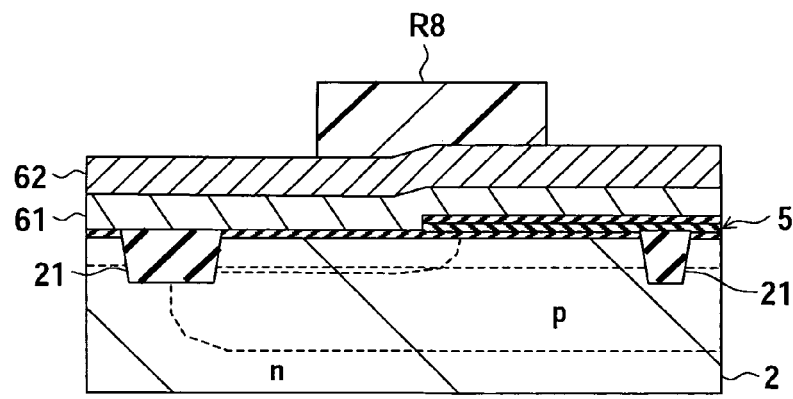

In the same way as the step corresponding to FIG. 10A of Structural Example 1, the assembly is washed, then phosphorus-doped polysilicon 61 is deposited, then tungsten silicide 62 is formed (FIG. 24A), and a resist R8 of the gate pattern is formed thereon (FIG. 24B).

Figure 25A:
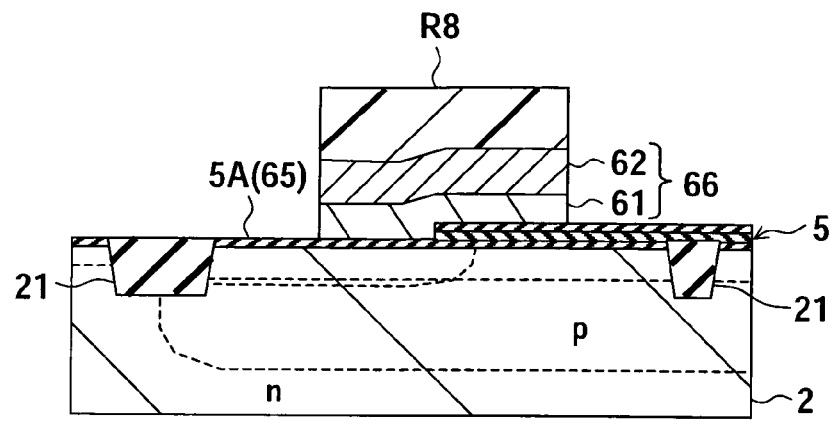
FIGS. 25A and 25B are sectional views continued from FIG. 24B showing the state up to formation of a deep S/D impurity region.
Figure 25B:
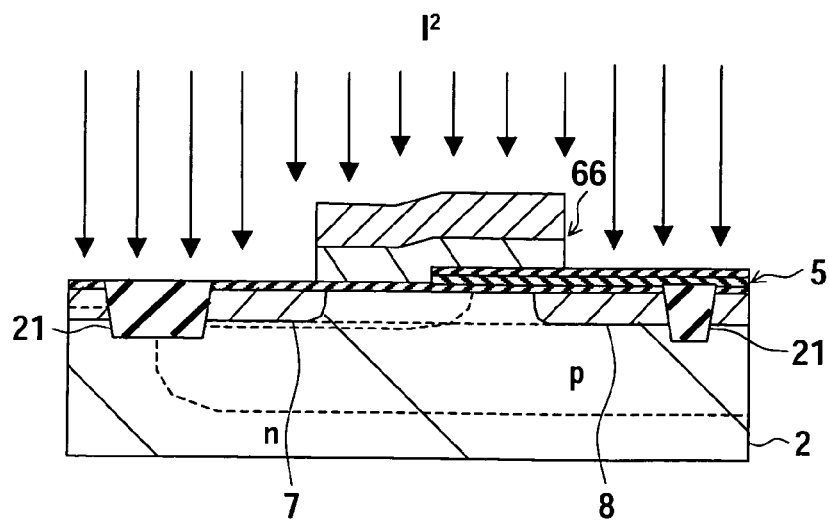

The tungsten silicide 62 and the phosphorus-doped polysilicon 61 are sequentially etched by dry etching using the resist R8 as a mask to form a common gate electrode 66 (FIG. 25A). The resist R8 is removed, then ion implantation of the N-type impurity is performed using the gate electrode 66 as a self alignment mask to thereby form two S/D impurity regions 7 and 8 (FIG. 25B). At this time, the ion implantation conditions of the deep S/D impurity region are selected. Thereafter, the assembly is washed, then annealed for activation to complete Structural Example 6.

In Structural Example 6, in the same way as Structural Example 5, in addition to the advantage that an extremely thin MOS inversion layer is utilized in order to promote the effects of the present invention, there is the following large advantage. When the MOS inversion layer is used as the conductive layer on the source side at the time of a write operation, the channel region with the high threshold voltage where a large short channel effect is expected (high Vth region 2D) sometimes exhibits a complete punch-through state. In Structural Example 6, in this case as well, the channel region with a low threshold voltage expected to function as the source (high Vth region 2E) is the MOS inversion layer, therefore the current flowing in the entire memory transistor follows the current characteristic of a MOS transistor.

On the other hand, in Structural Example 1 or Structural Example 2, use is made of the second conductivity type region (N-type impurity diffusion layer) as the source, therefore when a punch-through state is completely exhibited, a large current unable to be controlled by the gate voltage sometimes flows. In Structural Example 6, it is possible to prevent the generation of such a large current. This is important for not only the lowering the power consumption, but also for performing a stable write operation and becomes a large advantage when configuring the peripheral circuits. Note that this advantage is obtained also in the following Structural Example 7 in the same way as the above description. Further, as described in the first embodiment, this advantage is obtained by providing a channel concentration difference where the direction of application of the drain voltage is not changed between the time of a write operation and the time of a read operation.

STRUCTURAL EXAMPLE 7

Figure 26:
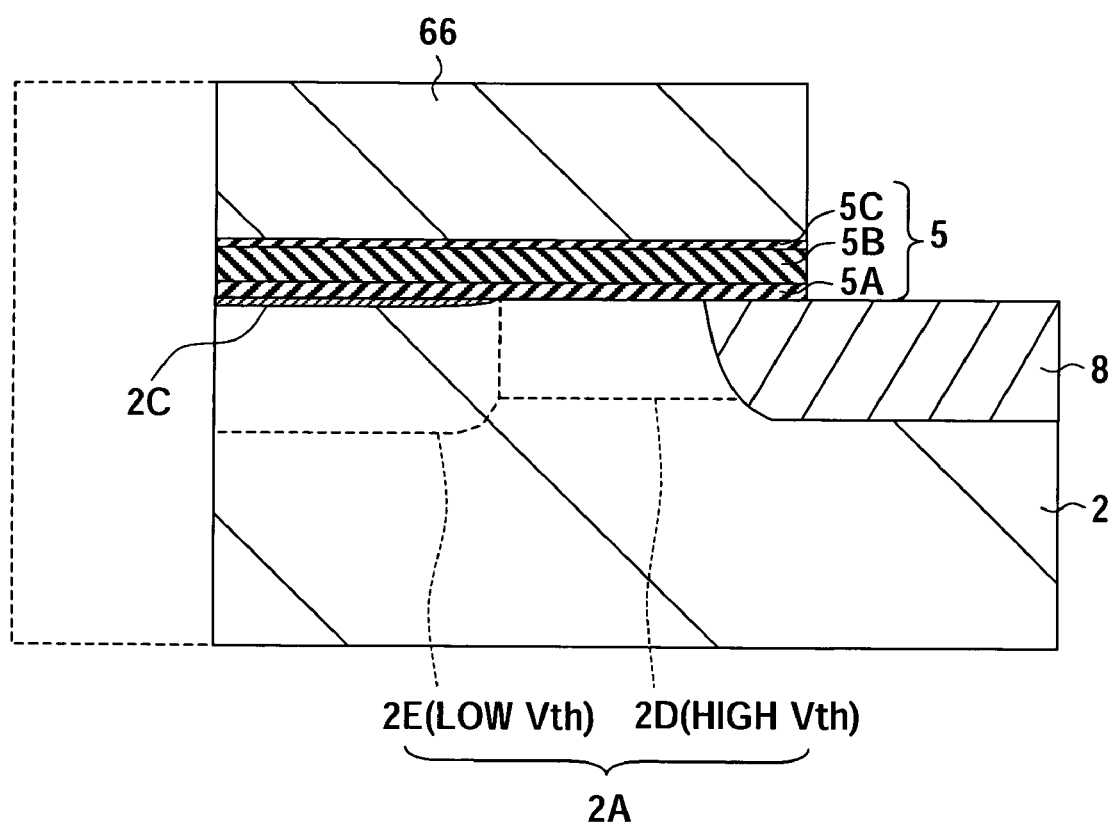
FIG. 26 is a sectional view of a memory transistor of a Structural Example 7.

Structural Example 7 shows the case where the ONO film (stacked-layer film) 5 is enlarged to above the low Vth region 2E in Structural Example 6. FIG. 26 is a sectional view of a memory transistor of Structural Example 7. In Structural Example 7 as well, it is necessary to change the impurity concentration of the channel formation region between the part for inducing an MOS inversion layer and the part not inducing the same. Note that the S/D impurity region at the side (portion of the broken line) not illustrated in FIG. 26 may be made any structure. It is possible to employ the structure of any of the other examples.

FIGS. 27A and 27B to FIGS. 28A and 28B are sectional views of states during the formation of Structural Example 7. Further, FIG. 29 shows a modification of the step corresponding to FIG. 28A. These are the same as in Structural Example 1 up to the formation of the ONO film (stacked-layer film) 5 (FIG. 9B), so the explanation will be omitted here.

Figure 27A:
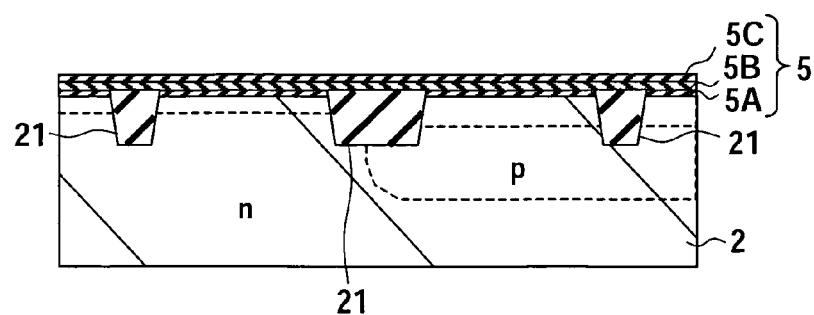
FIGS. 27A and 27B are sectional views showing the state up to formation of a resist of a gate pattern at the time of formation of Structural Example 7.
Figure 27B:
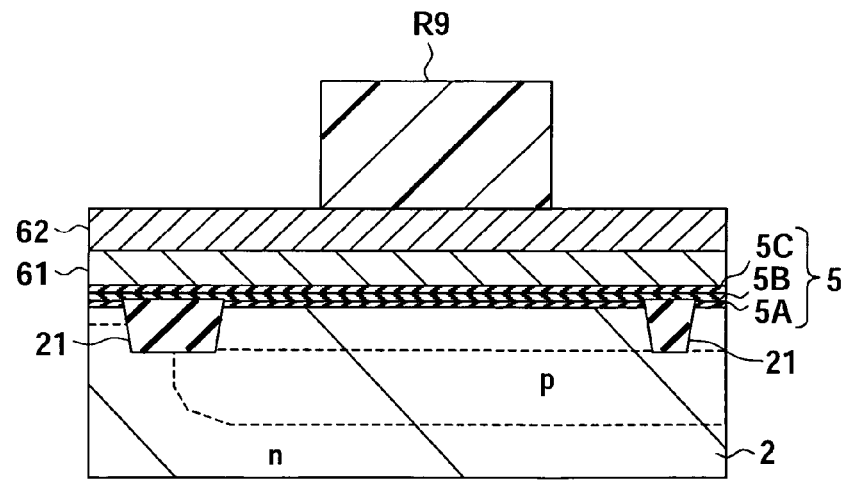

A stacked-layer film 5 is formed (FIG. 27A), then, in the same way as the step corresponding to FIG. 10A of Structural Example 1, the assembly is washed, then phosphorus-doped polysilicon 61 is deposited, tungsten silicide 62 is formed, and a resist R9 of the gate pattern is formed thereon (FIG. 27B). The tungsten silicide 62 and the phosphorus-doped polysilicon 61 are sequentially etched by etching using the resist R9 as a mask to form a common gate electrode 66. Subsequently, the second oxide film 5C and the nitride film 5B on the periphery of the gate electrode 66 are removed, then the resist R9 is removed.

Figure 28A:
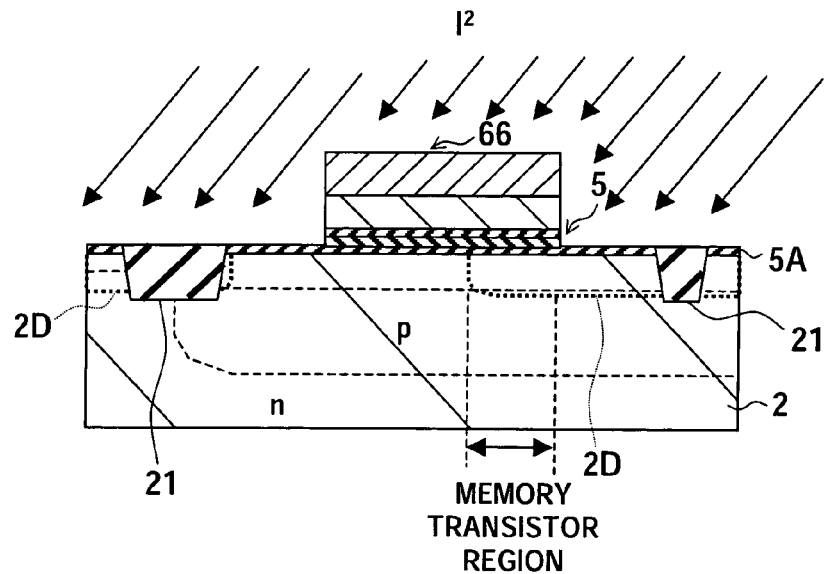
FIGS. 28A and 28B are sectional views continued from FIG. 27B showing the state up to formation of two S/D impurity regions.
Figure 29:
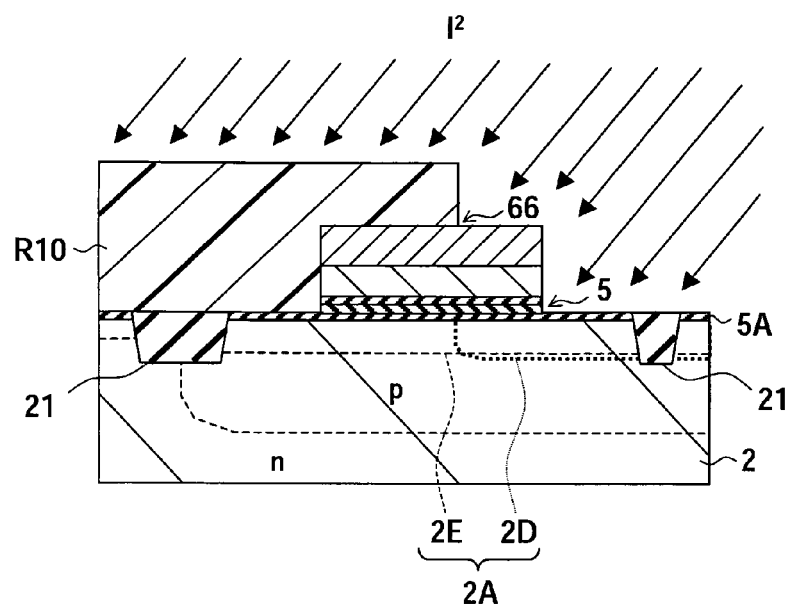
FIG. 29 is a sectional view showing a modification of an oblique ion injection process.

Next, the doping of the impurity defining the memory transistor region (high Vth region 2D) is performed by oblique ion implantation (FIG. 28A). At this time, as shown in FIG. 28A, an impurity region 2D is inevitably formed also in the substrate region of the gate electrode 66 far away on an opposite side to the side for forming the memory transistor region. In order to avoid this, as shown in FIG. 29, the side where the doping of the impurity is to be prevented may be protected by a resist R10 before the oblique ion implantation.

Figure 28B:
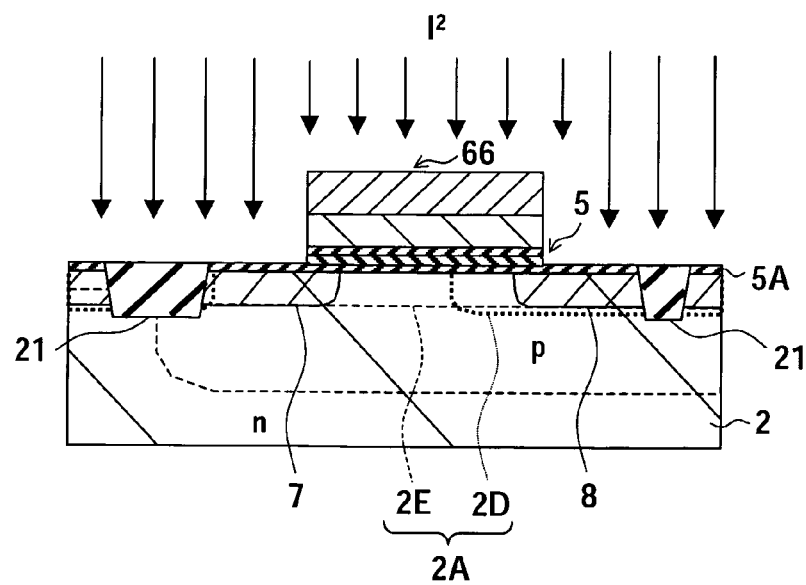

Finally, ion implantation is performed using the gate electrode 66 as a self alignment mask to form two S/D impurity regions 7 and 8 (FIG. 28B). In the ion implantation at this time, almost no angle is imparted. Further, the ion implantation conditions of a deep S/D impurity region are selected. Thereafter, the assembly is washed, then annealed for activation to complete Structural Example 7.

Figure 30:
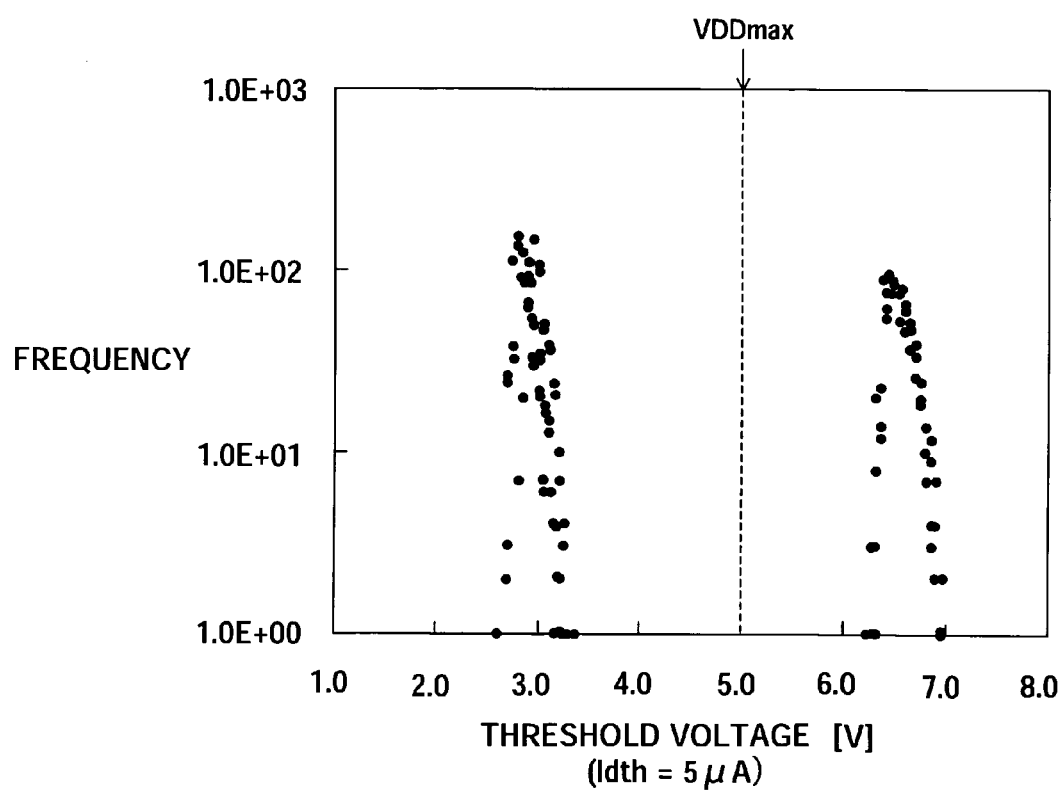
FIG. 30 is a graph showing a distribution of the change of threshold voltage according to a write operation.

FIG. 30 is a graph showing the distribution of the change of threshold voltage at a power voltage of 5V by a write operation on the memory transistor of Structural Example 7. As shown in FIG. 30, irrespective of the maximum voltage applied to the gate being 5V, the center of distribution in the threshold voltage distribution before a write operation (center of distribution: about 2.9V) becomes higher than the power voltage, i.e., about 6.5V, after a write operation.

Below, points of change common to the first and second embodiments will be explained.

The description up to here was made using an MONOS type memory transistor, but the present invention can also be applied to memory transistors other than this, for example, MNOS types and types for storing a charge in microcrystals of metal or a semiconductor buried in an insulation film in the discrete state (so-called "nanodots"). Especially, in Structural Example 1 to Structural Example 6 among the structural examples of the second embodiment, the charge storage circuit is not limited to a charge trap in the stacked-layer film having the charge holding ability of the MONOS type and the MNOS type. It is also possible to use a single conductive layer like a floating gate (FG) type as the charge storage circuit. It is possible to apply the nanodot type to all structural examples.

The storage film having the charge storage ability was simply described as an "oxide film" and "nitride film", but it is also possible to use materials selected from any of the following groups:

First group: Compounds including any of silicon (Si), aluminum (Al), gallium (Ga), indium (In), zinc (Zn), gadolinium (Gd), titanium (Ti), zirconium (Zr), hafnium (Hf), scandium (Sc), yttrium (Y), lanthanum (La) and other lanthanoid elements, vanadium (V), niobium (Nb), and tantalum (Ta) and oxygen (O);

Second group: Compounds including any of silicon (Si), aluminum (Al), gallium (Ga), indium (In), zinc (Zn), gadolinium (Gd), titanium (Ti), zirconium (Zr), hafnium (Hf), scandium (Sc), yttrium (Y), lanthanum (La) and other lanthanoid elements, vanadium (V), niobium (Nb), and tantalum (Ta) and nitrogen (N);

Third group: Compounds including any of silicon (Si), aluminum (Al), gallium (Ga), indium (In), zinc (Zn), gadolinium (Gd), titanium (Ti), zirconium (Zr), hafnium (Hf), scandium (Sc), yttrium (Y), lanthanum (La) and other lanthanoid elements, vanadium (V), niobium (Nb), and tantalum (Ta) and oxygen (O) and nitrogen (N);

Fourth group: Compounds including lanthanum (La) or aluminum (Al) and oxygen (O);

Fifth group: Compounds including yttrium (Y) or aluminum (Al) and oxygen (O);

Sixth group: Compounds including zirconium (Zr) or titanium (Ti) and oxygen (O);

Seventh group: Compounds including zirconium (Zr) or strontium (Sr) and oxygen (O); and Eighth group: Compound sincluding barium (Ba) or zirconium (Zr) and oxygen (O).

As to the relationship between these materials and the structural examples in the second embodiment, the storage means is not limited in Structural Example 1 to Structural Example 6. Any of a floating gate, nanodots, nitride film, or alumina or other material including a large amount of traps may be employed. In Structural Example 7, it is desirable not to allow the stored charge to escape from the memory transistor region such as with nanodots, a nitride film, or alumina or other material including a large amount of traps.

Further, the channel conductivity type of the memory device was described as the N-type, but it is also possible to apply the present invention to the case of the P-type. In that case, the conductivity types of the semiconductor regions acting as the channel, source, and the drain may be reversed from those described above and further the implanted charge may be reversed in polarity so as to apply the description up to here to a P-type memory device.

Further, the write operation was performed by injecting electrons into an N-type memory device, but according to certain memory cell array systems, the operation for injecting a charge in accordance with the logic of the data is called an "erase operation". Data is sometimes written at any memory cell (memory device) by draining a charge or injecting a charge having the reverse polarity. In such a case, the present invention can be applied to a write operation performed by implantation of a charge having the reverse polarity possible with the present invention. This operation further includes a case at the time of a write operation where holes are implanted and a case where electrons are implanted. Caution is desirable when performing an erase operation by injecting electrons all together and performing a write operation by injecting holes having a reverse polarity into any memory device. In this case, the relative voltage between non-written state and the written state and further the relative magnitude of voltages of the first and second levels in the non-written state become reverse to those in the following explanation. On the other hand, contrary to this, in the case where holes are implanted all together for an erase operation and electrons having the reverse polarity are implanted into any memory device for a write operation, this is the implantation of electrons when limited to a write operation, so the following explanation can be applied as it is.

According to the non-volatile semiconductor memory according to the embodiments of the present invention, the following effects are exhibited.

In a so-called combination non-volatile memory, in order to reduce the process cost necessary for combination, a reduction of the voltage of the memory operation is important. If it is possible to achieve a reduction of the voltage down to the voltage with which a transistor provided as standard may be used, a special high withstand voltage transistor becomes unnecessary and the additional steps for forming that become unnecessary. However, a reduction of the operating voltage, particularly the write voltage, induces a reduction of the threshold voltage after a write operation. This reduces the window of the threshold voltage at the time of a read operation. The variations in characteristics caused by the reduction of the operating voltage and the process are generally irrelevant. For this reason, a reduction of the operating voltage reduces the read operation margin and places a new load on the read operation circuit.

According the embodiments of the present invention, it is possible to set a high threshold voltage after a write operation more than the write voltage, therefore, even when the operating voltage is lowered, it is possible to enlarge the read threshold value margin. Accordingly, in a non-volatile memory memory using the present invention, technology for increasing the speed of the circuit so as to make up for problems newly arising along with a reduction of the voltage, that is, the need for a higher precision of the read system circuit accompanying a reduction in the margin or a smaller read threshold voltage difference and therefore an increase of the read operation time etc., is not necessary. From this, not only is the cost reduction effect expected by the reduction of the voltage not degraded, but also a higher performance can be conversely expected. Further, even when a channel formation region with a high threshold voltage where occurrence of a large short channel effect is expected exhibits a complete punch-through state, the channel region having a low threshold voltage which had been expected to function as the source functions as an MOS inversion layer, and the current may be controlled by the gate voltage. This is important for a stable write operation and becomes a major advantage when forming the peripheral circuits.

It should be understood by those skilled in the art that various modifications, combinations, sub-combinations, and alterations may occur depending on design requirements and other factors insofar as they are within the scope of the appended claims or the equivalents thereof.

What is claimed is:

1. A non-volatile semiconductor memory comprising:
a memory transistor including:
   a stacked-layer film formed between a semiconductor substrate and a gate electrode and having a charge storage ability,
   a first conductivity type region formed in the semiconductor substrate in which a channel is formed under the control of the gate electrode via the stacked-layer film, and
   two second conductivity type regions formed in the semiconductor substrate sandwiching the first conductivity type region therebetween,
   wherein
   a thickness of the first conductivity type region in a stacking direction of the stacked-layer film is not greater than a thickness of either one of the two second conductivity type regions, and
   a channel length L is between channel lengths L1 and L2, with L1 being estimated for determining the boundary of occurrence of short channel effects at the time of a write operation and L2 at the time of a read operation, and L1 is different from L2.

2. A non-volatile semiconductor memory as set forth in claim 1, wherein the channel length L of the actual device of said memory transistor is set to a value simultaneously satisfying the following two relations:

$$L < A \, (Xj1 \, (\in/C) \, (Ws \, (Nb, Vdr)) + Wd \, (Nb, Vdr))^2)^{1/3}$$

$$L > A \, (Xj2 \, (\in/C) \, (Ws \, (Nb, Vdw)) + Wd \, (Nb, Vdw))^2)^{1/3}$$

where,
A is an experimentally obtained coefficient (or simply a coefficient),
Xj1 is a depth of junction of bottom of drain from surface of substrate at time of read operation,
Xj2 is a depth of junction of bottom of drain from surface of substrate at time of write operation,
$\in$ is an effective dielectric constant of stacked-layer film,
C is a capacity between the gate electrode and semiconductor substrate,
Ws is a width of depletion layer extending from source to the substrate side,
Wd is a width of depletion layer extending from drain to substrate side,
Nb is a channel impurity concentration,
Vdr is a drain voltage at time of read operation, and
Vdw is a drain voltage at time of write operation.

3. A non-volatile semiconductor memory as set forth in claim 1, wherein the memory transistor has a device structure of which at least one of the structural parameters defining the channel lengths L1 and L2.

4. A non-volatile semiconductor memory as set forth in claim 1, wherein the memory transistor has a device structure of which at least one of the structural parameters defining the channel lengths length L1 at the time of a write operation when using one of the two second conductivity regions as a drain and the channel length L2 at the time of a read operation when using the other as the drain.

5. A non-volatile semiconductor memory as set forth in claim 4, wherein a depth to a bottom junction of the drain from the surface of said first conductivity type region, as the structural parameter, and a depth to a bottom junction of the source from the surface of said first conductivity type region, as the structural parameter, are different.

6. A non-volatile semiconductor memory as set forth in claim 4, wherein an impurity concentration of a drain side of said first conductivity type region, as the structural parameter, and an impurity concentration of a source side of said first conductivity region, as the structural parameter, are different.

7. A non-volatile semiconductor memory comprising:
a memory transistor including:
   a stacked-layer film formed between a semiconductor substrate and a gate electrode and having a charge storage ability, a first conductivity type region of the semiconductor substrate in which a channel is formed under the control of the gate electrode via the stacked-layer film, and two second conductivity type regions formed at the semiconductor substrate sandwiching the first conductivity type region therebetween, wherein a thickness of the first conductivity type region in the stacking direction of the stacked-layer film is not greater than a thickness of either one of the two second conductivity type regions, the memory transistor has a device structure of which at least one of the structural parameters defining the channel length L1 at the time of a write operation when using one of the two second conductivity regions as a drain and the channel length L2 at the time of a read operation when using the other as the drain, and the channel length L1 is estimated for determining the boundary of occurrence of short channel effects at the time of a write operation and the channel length L2 is at the time of a read operation with L1 being different from L2.

8. A non-volatile semiconductor memory as set forth in claim 7, wherein a depth to a bottom junction of the drain from the surface of said first conductivity type region, as the structural parameter, and a depth to a bottom junction of the source from the surface of said first conductivity type region, as the structural parameter, are different.

9. A non-volatile semiconductor memory as set forth in claim 7, wherein an impurity concentration of a drain side of said first conductivity type region, as the structural parameter, and an impurity concentration of a source side of said first conductivity region, as the structural parameter, are different.

10. A non-volatile semiconductor memory as set forth in claim 7, wherein Lmin representing a minimum value of the channel length L of the boundary of occurrence of the short channel effect is estimated based on the following relations:

$$Lmin = p_{1/3}$$

$$p(Xj, C, Nb) = Xj \ (\in/C) \ (Ws(Nb) + Wd(Nb))^2$$

where, A is an experimentally obtained coefficient (or simply a coefficient),

Xj is a depth of junction of bottom of drain from surface of substrate, $\in$ is an effective dielectric constant of stacked-layer film, C is a capacity between the gate electrode and semiconductor substrate, Ws is a width of depletion layer extending from source to the substrate side, Wd is a width of depletion layer extending from drain to substrate side, and Nb is a channel impurity concentration.

* * * * *